US007263150B2

(12) United States Patent
Ishida et al.

(10) Patent No.: US 7,263,150 B2
(45) Date of Patent: Aug. 28, 2007

(54) PROBABILITY ESTIMATING APPARATUS AND METHOD FOR PEAK-TO-PEAK CLOCK SKEWS

(75) Inventors: Masahiro Ishida, Miyagi (JP); Takahiro Yamaguchi, Miyagi (JP); Mani Soma, Seattle, WA (US)

(73) Assignee: Advantest Corp., Tokyo (JP)

( * ) Notice: Subject to any disclaimer, the term of this patent is extended or adjusted under 35 U.S.C. 154(b) by 523 days.

(21) Appl. No.: 10/082,563

(22) Filed: Feb. 23, 2002

(65) Prior Publication Data
US 2003/0031284 A1 Feb. 13, 2003

Related U.S. Application Data

(60) Provisional application No. 60/277,251, filed on Mar. 20, 2001.

(51) Int. Cl.
*H04L 25/38* (2006.01)
*H04D 3/24* (2006.01)

(52) U.S. Cl. ............... 375/371; 375/362; 375/359; 375/355

(58) Field of Classification Search ........... 375/371, 375/215, 264, 226, 350, 307, 355, 364, 362, 375/359, 354, 284, 346; 702/179, 181; 455/463, 455/67.13, 9, 10
See application file for complete search history.

(56) References Cited

U.S. PATENT DOCUMENTS 4,542,514 A * 9/1985 Watanabe ............... 375/226
4,654,861 A * 3/1987 Godard ................... 375/226
5,402,443 A * 3/1995 Wong ..................... 375/226
5,757,652 A * 5/1998 Blazo et al. .............. 702/69
6,263,034 B1 * 7/2001 Kanack et al. ........... 375/371
6,442,214 B1 * 8/2002 Boleskei et al. ......... 375/299
6,640,193 B2 * 10/2003 Kuyel ...................... 702/69
6,661,836 B1 * 12/2003 Dalal et al. .............. 375/226
6,661,860 B1 * 12/2003 Gutnik et al. ............ 375/354
6,775,321 B1 * 8/2004 Soma et al. .............. 375/226

(Continued)

OTHER PUBLICATIONS

Voorakaranam et al, "Low-Jitter Measurement Technique for Phase-Locked loops", Circuits and Systems, 2000. Proceedings of the 43rd IEEE Midwest Symposium on, Aug. 2000, vol. 2, pp. 956-959.*

(Continued)

*Primary Examiner*—Mohammed Ghayour
*Assistant Examiner*—Qutub Ghulamali
(74) *Attorney, Agent, or Firm*—Muramatsu & Associates

(57) ABSTRACT

A probability estimating apparatus and method for peak-to-peak clock skews for testing the clock skews among a plurality of clock signals distributed by a clock distributing circuit, and for estimating the generation probability of the peak-to-peak value or peak value of the clock skews. The probability estimating apparatus for peak-to-peak values in clock skews includes a clock skew estimator for estimating clock skew sequences among the plurality of clock signals under test and a probability estimator for determining a generation probability of the peak-to-peak values in the clock skews among the plurality of clock signals under test based on the clock skew sequences from the clock skew estimator by applying Rayleigh distribution. The generation probability of the peak-to-peak value is estimated based on RMS values of the clock signals and the Rayleigh distribution.

37 Claims, 23 Drawing Sheets

Clock Skew Estimator 900

U.S. PATENT DOCUMENTS 6,882,680 B1 * 4/2005 Oleynik .................. 375/147
6,922,452 B2 * 7/2005 Sandberg ................ 375/346

OTHER PUBLICATIONS

Voorakaranam et al "Low-cost Jitter Measurement Technique for Phase-Locked Loop", (Proceedings of the 43rd IEEE Midwest Symposium on Circuits and Systems, 2000).*

Voorakaranam et al "Low-coat Jitter Measurement Technique for Phase-Locked Loop", Proceedings of the 43rd IEEE Midwest Symposium on Circuits and Systems, vol. 2, Aug. 8-11, 2000 pp. 956-959.*

"Jitter Measurement of a PowerPC Microprocessor Using an Analytic Signal Method" IEEE Test Conference, Aug. 8-11, 2000, pp. 956-959.

"Extraction of Peak-to-Peak and RMS Sinusoidal Jitter Using an Analytic Signal Method" 18th TLSI Test Symposium, Apr. 30-May 4, 2000, pp. 395-402.

* cited by examiner

Clock Skew Estimator 500

Deterministic Clock Skew Estimator 700

Clock Skew Measurement Apparatus 1100

Clock Skew Estimator 2300

PROBABILITY ESTIMATING APPARATUS AND METHOD FOR PEAK-TO-PEAK CLOCK SKEWS

This application claims the benefit of U.S. Provisional Application No. 60/277,251 filed Mar. 20, 2001.

FIELD OF THE INVENTION

This invention relates to a probability estimating apparatus and method for peak-to-peak clock skews for testing the clock skews among a plurality of clock signals distributed by a clock distributing circuit, and for estimating the generation probability of the peak-to-peak value or peak value of the clock skews.

BACKGROUND OF THE INVENTION

Traditionally, the clock skews, as shown in FIG. 1, are statistically estimated by using a time interval analyzer or a frequency counter. The time interval analyzer measures the time difference of zero-crossing points between the clock signals under test and a reference clock signal, then measures the fluctuations of the time difference through histogram analysis. An example of such a clock skew measurement using a time interval analyzer is described in *Jitter Analysis Clock Solutions*, by Wavecrest Corporation, 1998.

When evaluating reliability of a microprocessor, for example, it is effective to determine whether the probability of peak-to-peak clock skews in the clocks distributed within the microprocessor exceeds a predetermined value, or to confirm that the generation probability of the peak-to-peak value in the clock skews will not exceed the predetermined value. However, since the generation probability of the peak-to-peak value of the clock skews have never been theoretically analyzed, the traditional method requires an enormous amount of data to estimate the generation probability of the peak-to-peak value of the clock skews, and thus, requiring a large amount of time.

SUMMARY OF THE INVENTION

It is, therefore, an object of the present invention to provide a probability estimating apparatus and method for peak-to-peak clock skews for estimating the probability of the peak-to-peak value among the clock signals under test to see whether it exceeds the predetermined value, as well as estimating the generation probability of the peak-to-peak value in the clock skews in a much shorter time.

The above object is achieved by the probability estimating apparatus for peak-to-peak clock skews of the present invention which is characterized by having a clock skew estimator for estimating the clock skew sequences between a plurality of clock signals under test, and a probability estimator for determining and outputting the generation probability of the peak-to-peak value of the clock skews among the clock signals under test based on the clock skew sequences.

Further, in the probability estimating apparatus for peak-to-peak clock skews, preferably, the probability estimator determines and outputs the generation probability of the peak-to-peak value of the clock skews among the clock signals under test based on the clock skew sequences.

Further, in the probability estimating apparatus for peak-to-peak clock skews, preferably, the probability estimator is comprised of an RMS (root mean square) detector for determining the RMS value of the clock skew sequence data supplied thereto, a memory for storing a predetermined value, and a probability calculator for determining and outputting the probability of the peak-to-peak clock skews among the signals under test to determine whether the probability exceeds the predetermined value based on the predetermined value and the RMS value.

Further, in the probability estimating apparatus for peak-to-peak clock skews, preferably, the probability estimator is comprised of an RMS detector for determining the RMS value of the clock skew sequence data supplied thereto, a peak-to-peak detector for calculating the difference between the maximum and minimum values based on the clock skew sequence data to determine the peak-to-peak value, and a probability calculator for obtaining and outputting the probability of the clock skews among the clock signals under test to determine whether the probability exceeds the peak-to-peak value based on the peak-to-peak value and the RMS value of those clock skew sequence data.

Further, in the probability estimating apparatus for peak-to-peak clock skews, preferably, the clock skew estimator is furnished with a timing jitter estimator for estimating the timing jitter sequences of a plurality of clock signals under test, and a clock skew calculator for receiving a plurality of those timing jitter sequences as inputs and calculating the timing difference sequences among the timing jitter sequences to output the clock skew sequences.

Further, in the probability estimating apparatus for peak-to-peak clock skews, preferably, the clock skew estimator is furnished with a second clock skew calculator for receiving the clock skew sequences as inputs to determine the difference among the plurality of those clock skew sequences.

Further, in the probability estimating apparatus for peak-to-peak clock skews, preferably, the clock skew estimator is furnished with a frequency multiplier for receiving the timing jitter sequences as inputs to produce timing jitter sequences by multiplying the frequency of the clock signals under test.

Further, in the probability estimating apparatus for peak-to-peak clock skews, preferably, the clock skew estimator is furnished with a deterministic clock skew estimator for estimating the timing errors among ideal clock edges of a plurality of clock signals under test to output the deterministic components of those clock skews.

Further, in the probability estimating apparatus for peak-to-peak clock skews, preferably, the timing jitter estimator is comprised of an analytic signal transformer for transforming the clock signals under test into analytic signals of complex number, an instantaneous phase estimator for determining an instantaneous phase of the analytic signals, a linear phase remover for removing the linear phase from the instantaneous phase to obtain instantaneous phase noise, and a zero-crossing resampler for receiving the instantaneous phase noise as inputs and resampling only the instantaneous phase noise data closest to the zero-crossing timings of the real number in the analytic signals to output the timing jitter sequences.

Further, in the probability estimating apparatus for peak-to-peak clock skews, preferably, the analytic signal transformer is comprised of a band-pass filter for receiving the clock signals under test and extracting only the components closest to the fundamental frequency from the clock signals under test to band-limit the clock signals under test, and a Hilbert transformer for Hilbert-transforming the output signals of the band-pass filter to generate a Hilbert converted pair of the clock signals.

Further, in the probability estimating apparatus for peak-to-peak clock skews, preferably, the analytic signal transformer is comprised of a time domain to frequency domain transformer for receiving the clock signals under test and transforming the clock signals into both-side spectra signals in a frequency domain, a bandwidth limiter for extracting only the components closest to the positive fundamental frequency from the both-side spectra signals, and a frequency domain to time domain transformer for transforming the outputs of the bandwidth limiter back to the time domain signals.

Further, in the probability estimating apparatus for peak-to-peak clock skews, preferably, the analytic signal transformer is comprised of a buffer memory for storing the clock signals under test, means for sequentially extracting the signals from the buffer memory while overlapping a part of the extract signals with the ones previously extracted, means for multiplying a window function by each extracted part of the signal, means for transforming each multiplied part of the signal into the both-side spectra signals in the frequency domain, a bandwidth limiter for extracting only the components closest to the positive fundamental frequency of the clock signals under test from the both-side spectra signals transformed into the frequency domain, means for transforming the outputs of the band-pass filter back to time domain signals, and means for multiplying an inverse of the window function by the signals transformed to the time domain to obtain band-limited analytic signals.

Further, in the probability estimating apparatus for peak-to-peak clock skews, preferably, the clock skew estimator is furnished with an AD converter for receiving the clock signals under test as inputs and digitizing the analog signals to covert to digital signals.

Further, in the probability estimating apparatus for peak-to-peak clock skews, preferably, the clock skew estimator is furnished with a waveform clipper for receiving the clock signals under test as inputs and removing the amplitude modulation components to extract only the phase modulation components of the clock signals under test.

Further, in the probability estimating apparatus for peak-to-peak clock skews, preferably, the analytic signal transformer has an adjustable pass band for the clock signals under test.

Further, in the probability estimating apparatus for peak-to-peak clock skews, preferably, the timing jitter estimator is furnished with a low frequency component remover for receiving the instantaneous phase noise as inputs and removing the low frequency components from the instantaneous phase noise before providing the instantaneous phase nose to the zero-crossing resampler.

Further, the above object is achieved by the probability estimating method for peak-to-peak clock skews of the present invention characterized by having a step of estimating the clock skew sequences among a plurality of clock signals under test, and a step of determining and outputting the generation probability of the peak-to-peak value of the clock skews among the clock signals under test based on the clock skew sequences.

Further, the object is achieved by the probability estimating method for peak-to-peak clock skews characterized by having a step of estimating the clock skew sequences among a plurality of clock signals under test, and a step of determining and outputting the generation probability of the peak value of the clock skews among the clock signals under test based on the clock skew sequences.

Further, in the above probability estimating method for peak-to-peak clock skews, the step for determining the generation probability of the clock skew peak value is preferably comprised of a step of determining an RMS (root mean square) value of the clock skew sequence data supplied thereto, and a step of determining the probability for the peak-to-peak clock skews among the clock signals under test which exceeds the predetermined value based on the predetermined value and the RMS value of the clock skew sequence data.

Further, in the above probability estimating method for peak-to-peak clock skews, the step for determining the generation probability of the clock skew peak value is preferably comprised of a step of determining the RMS value of the clock skew sequence data supplied thereto, a step of calculating the difference between the maximum and minimum values of the clock skew sequence data to determine the peak-to-peak value, and a step of determining the probability of the clock skews among the clock signals under test that exceeds the peak-to-peak value based on the peak-to-peak value and the RMS value of the clock skew sequence data.

Further, in the probability estimating method for peak-to-peak clock skews, the step for estimating the clock skew sequence data is preferably comprised of a step of estimating the timing jitter sequences of a plurality of clock signals under test, and a step of receiving the plurality of timing jitter sequences and calculating differences among the timing jitter sequences to estimate the clock skew sequences.

Further, in the probability estimating method for peak-to-peak clock skews, the step for estimating the clock skew sequences is preferably comprised of a step of receiving the above clock skew sequences and determining the differences among the plurality of the clock skew sequences to estimate the clock skew sequences.

Further, in the probability estimating method for peak-to-peak clock skews, the step for estimating the clock skew sequences is preferably comprised of a step of receiving the timing jitter sequences and estimating the timing jitter sequences by multiplying the frequency of the clock signals under test.

Further, in the probability estimating method for peak-to-peak clock skews, the step for estimating the clock skew sequences is preferably comprised of a step of estimating the timing errors among the ideal clock edges of a plurality of clock signals under test to estimate the deterministic components of the clock skews.

Further, in the probability estimating method for peak-to-peak clock skews, the step for estimating the timing jitter sequences is preferably comprised of a step of transforming the clock signals under test into analytic signals of complex numbers, a step of determining the instantaneous phase of the clock signals under test based on the analytic signals, a step of removing the linear phase from the instantaneous phase to estimate the instantaneous phase noise, and a step of receiving the instantaneous phase noise and resampling only the instantaneous phase noise data closest to the zero-crossing timings of real number in the analytic signals to output the timing jitter sequences.

Further, in the probability estimating method for peak-to-peak clock skews, the step for transforming the signals under test into analytic signals is preferably comprised of a step of extracting only the components closest to the fundamental frequency of the clock signals under test to band-limit the clock signals under test, and a step of Hilbert-transforming the output signals from the band-pass filter to generate a Hilbert transformed pair of the input signals.

Further, in the probability estimating method for peak-to-peak clock skews, the step for transforming the clock signals under test into analytic signals is preferably comprised of a step of transforming the clock signals under test into both-side spectra signals in a frequency domain, a step of extracting only the components closest to the positive fundamental frequency from the both-side spectra signals, and a step of transforming the outputs of the bandwidth limiter back to time domain signals.

Further, in the probability estimating method for peak-to-peak clock skews, the step for transforming the clock signals under test into analytic signals is preferably comprised of a step of collecting the clock signals under test in a buffer memory, a step of sequentially extracting the signals from the buffer memory while overlapping a part of the extracted signals with the ones previously extracted, a step of multiplying a window function by each extracted part of the signal, a step of transforming each multiplied part of the signal into both-side spectra signals in the frequency domain, a step of extracting only the components closest to the positive fundamental frequency of the clock signals under test from the both-side spectra signals transformed into the frequency domain, a step of transforming the band-limited spectra signals into time domain signals, and a step of multiplying an inverse window function by the signals transformed into the time domain to obtain band-limited analytic signals.

Further, in the probability estimating method for peak-to-peak clock skews, the step for estimating the deterministic components of the clock skews among the clock signals under test is preferably comprised of a step of determining the deterministic components of the clock skews by receiving the linear instantaneous phase of a plurality of clock signals under test and determining the difference between the initial phase angles of the linear instantaneous phase.

Further, in the probability estimating method for peak-to-peak clock skews, the step for estimating the deterministic components of the clock skews among the clock signals under test is preferably comprised of a step of estimating the clock edges corresponding to the clock signals and determining the offset value of the clock edges by receiving the timing jitter sequences of a plurality of clock signals under test and determining the correlation among the timing jitter sequences.

Further, in the probability estimating method for peak-to-peak clock skews, the step for estimating the deterministic components of the clock skews among the clock signals under test is preferably comprised of a step of determining the deterministic components of the clock skews by receiving the plurality of clock signals under test and determining the average of the zero-crossing timing errors among the clock signals under test.

Further, in the probability estimating method for peak-to-peak clock skews, the step for estimating the clock skew sequences is preferably comprised of a step of conducting waveform clipping on the clock signals under test to remove the amplitude modulation components, thereby extracting only the phase modulation components from the clock signals under test.

Further, in the probability estimating method for peak-to-peak clock skews, the step for estimating the timing jitters is preferably comprised of a step of receiving the instantaneous phase noise and removing the low frequency components from the instantaneous phase noise.

DETAILED DESCRIPTION OF THE INVENTION

The structure and operations of the present invention will be described in detail below. In the following, MPU clock signals are used as signals to be tested for the purpose of explanation of the invention.

Figure 1:
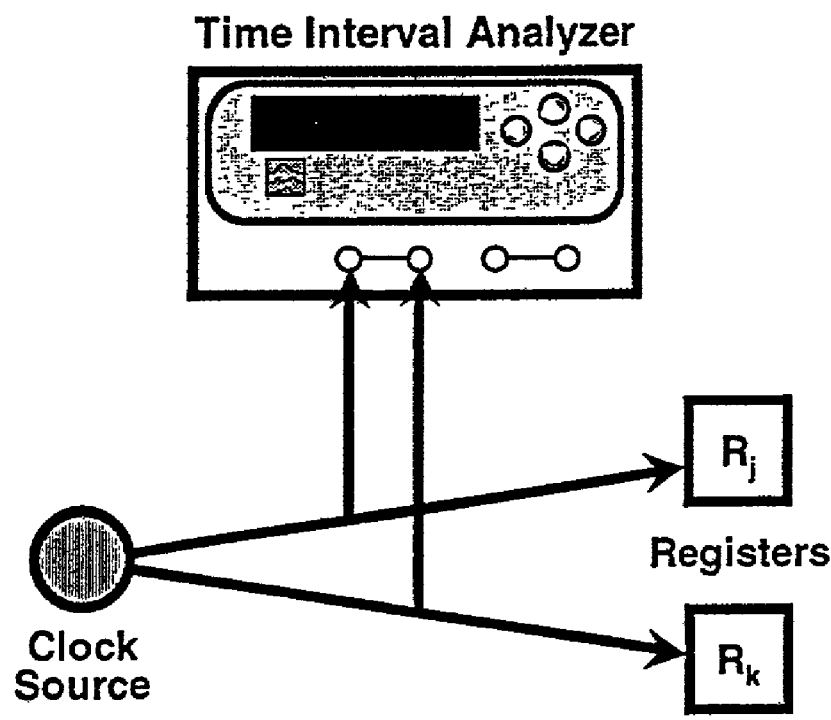
FIG. 1 is a diagram showing an example of clock skew measurement using a time interval analyzer.
Figure 2A:
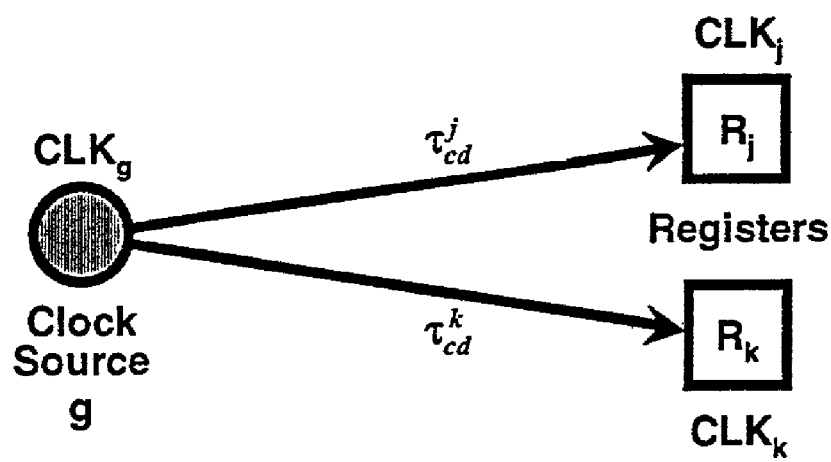
FIG. 2A is a schematic diagram showing a clock network for distributing clock signals.

First, the clock skew will be defined. As shown in FIG. 2A, where, for example, the clock source of the clock distribution network is used as a reference point, the clock skew is defined as a difference between delay times $\tau^j_{cd}$ and $\tau^k_{cd}$ before clock signals $CLK_j$ and $CLK_k$ arrive at registers $R_j$ and $R_k$.

$$T_{Skew}^{j,k}(nT) = \tau_{cd}^k(nT) - \tau_{cd}^j(nT) \tag{1}$$

Figure 2B:
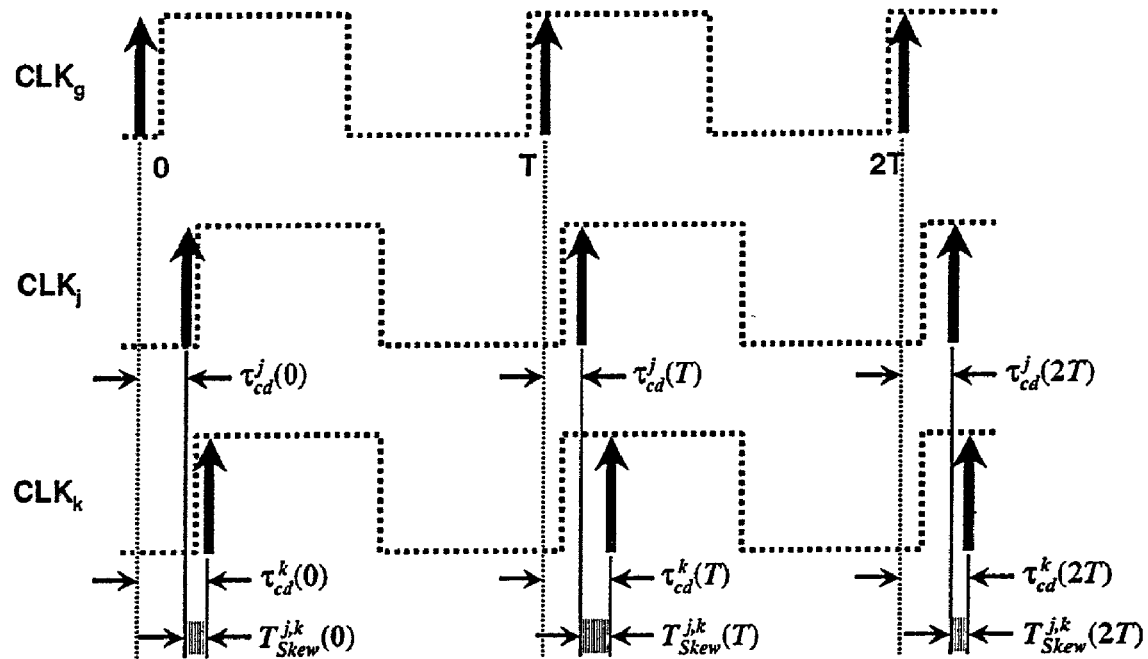
FIG. 2B is a schematic diagram showing the timing relationships among the clock skews.

FIG. 2B shows the timings of the clock skews. Here, T is a fundamental clock period of the clock signals under test.

The rising edge times of the clock signal $CLK_g$, $CLK_j$, and $CLK_k$ are denoted by $t^g_{cd}$, $t^j_{cd}$, and $t^k_{cd}$ respectively. Also, when the ideal clock edge time (the jitter-free clock edge time) of each clock signal $CLK_g$, $CLK_j$, and $CLK_k$ is denoted by $(nT)_g$, $(nT)_j$, and $(nT)_k$, the delay times $\tau^j_{cd}$ and $\tau^k_{cd}$ will be respectively expressed as follows:

$$\begin{aligned}\tau_{cd}^j(nT) &= t_{cd}^j(nT) - t_{cd}^g(nT) \\ &= [t_{cd}^j(nT) - (nT)_j] - [t_{cd}^g(nT) - (nT)_g] + \{(nT)_j - (nT)_g\} \\ &= \tau_{Skew}^{g,j} + \left[\Delta\phi^j[n]\left(\frac{T_j}{2\pi}\right) - \Delta\phi^g[n]\left(\frac{T_g}{2\pi}\right)\right] \quad [\text{sec}]\end{aligned} \tag{2}$$

$$\begin{aligned}\tau_{cd}^k(nT) &= t_{cd}^k(nT) - t_{cd}^g(nT) \\ &= [t_{cd}^k(nT) - (nT)_k] - [t_{cd}^g(nT) - (nT)_g] + \{(nT)_k - (nT)_g\} \\ &= \tau_{Skew}^{g,k} + \left[\Delta\phi^k[n]\left(\frac{T_k}{2\pi}\right) - \Delta\phi^g[n]\left(\frac{T_g}{2\pi}\right)\right] \quad [\text{sec}]\end{aligned} \tag{3}$$

The following equations express the respective time differences between the ideal clock edge times of $CLK_j$, $CLK_k$ and the ideal clock edge time $CLK_g$, and correspond to the deterministic components (deterministic clock skew values) of the clock skew determined by signal paths.

$$\tau_{Skew}^{g,j} = (nT)_j - (nT)_g \ [\text{sec}] \tag{4}$$

$$\tau_{Skew}^{g,k} = (nT)_k - (nT)_g \ [\text{sec}] \tag{5}$$

In addition, $\Delta\phi^g[n](T_g/2\pi)(=t^g_{cd}(nT)-(nT)_g)$, $\Delta\phi^j[n](T_j/2\pi)(=t^j_{cd}(nT)-(nT)_j)$, and $\Delta\phi^k[n](T_k/2\pi)(=t^k_{cd}(nT)-(nT)_k)$ express the timing jitter sequences (unit in second) of the clock signals $CLK_g$, $CLK_j$, and $CLK_k$ respectively. When equations (2) and (3) are substituted into equation (1), the clock skew $T^{j,k}_{Skew}$ in $CLK_j$ and $CLK_k$ will be estimated as follows:

$$T_{Skew}^{j,k}[n] = \left\{\tau_{Skew}^{g,k} + \left[\Delta\phi^k[n]\left(\frac{T_k}{2\pi}\right) - \Delta\phi^g[n]\left(\frac{T_g}{2\pi}\right)\right]\right\} \quad (6)$$
$$- \left\{\tau_{Skew}^{g,j} + \left[\Delta\phi^j[n]\left(\frac{T_j}{2\pi}\right) - \Delta\phi^g[n]\left(\frac{T_g}{2\pi}\right)\right]\right\}$$
$$= \tau_{Skew}^{j,k} + \left[\Delta\phi^k[n]\left(\frac{T_k}{2\pi}\right) - \Delta\phi^j[n]\left(\frac{T_j}{2\pi}\right)\right] \quad [\text{sec}]$$

The second member in the equation (6) as noted below corresponds to the random variation (random component) of the clock skew based on the timing jitters in each clock signal.

$$\left[\Delta\phi^k[n]\left(\frac{T_k}{2\pi}\right) - \Delta\phi^j[n]\left(\frac{T_j}{2\pi}\right)\right]$$

Figure 3:
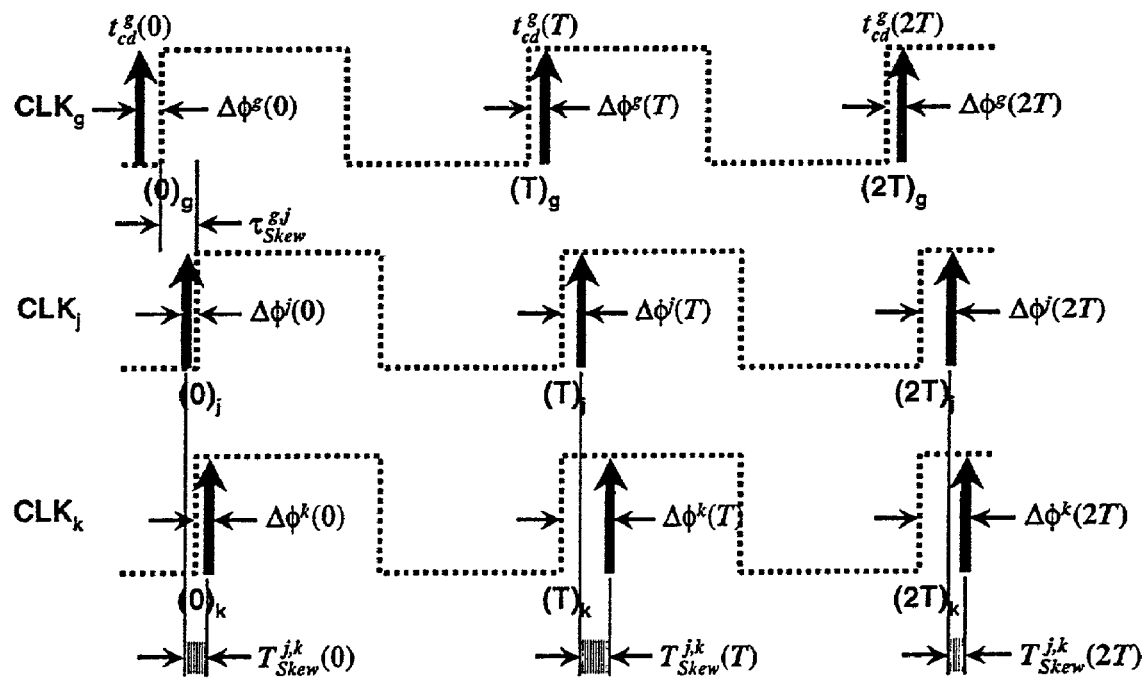
FIG. 3 is a schematic diagram showing the timing relationships between the timing jitters and the clock skews.

In other words, this clock skew estimation method can determine the random distribution of a clock skew by combining the amount of difference between the clock edge of each clock signal and the ideal clock edge, namely, the timing jitters of each clock signal. Here, the fundamental periods of the generally distributed clock signals $CLK_j$ and $CLK_k$ are identical to one another ($T_j=T_k$). FIG. 3 shows the relationship between the timing jitter and clock skew.

The following equation expresses the difference between the rising edge times of the ideal clocks of the clock $CLK_j$ and $CLK_k$, and are the deterministic components of the clock skew determined by the signal paths of the clock distribution network:

$$\tau_{Skew}^{j,k} = (nT)_k - (nT)_j \quad [\text{sec}] \quad (7)$$

The deterministic clock skew value $\tau^{j,k}_{Skew}$, for example, can be determined by the instantaneous phases of two signals $CLK_j$, $CLK_k$ under test and the difference between their linear phase components in the instantaneous phases. The fundamental cosine wave components of the signals $CLK_j$ and $CLK_k$ are as follow:

$$x_j(t) = A_j\cos(\phi^j(t)) = A_j\cos\left(\frac{2\pi}{T_j}t + \phi_0^j - \Delta\phi^j(t)\right) \quad (8)$$

$$x_k(t) = A_k\cos(\phi^k(t)) = A_k\cos\left(\frac{2\pi}{T_k}t + \phi_0^k - \Delta\phi^k(t)\right) \quad (9)$$

Here, the instantaneous phases of $x_j(t)$ and $x_k(t)$ are respectively expressed by the sum of the instantaneous linear phase component $2\pi t/T_L$ having the fundamental period $T_L$ ($L=j$, $k$), initial phase angle $\phi^L_0$ ($L=j$, $k$), and instantaneous phase noise component $\Delta\phi^L(t)$ ($L=j,k$).

$$\phi^j(t) = \frac{2\pi}{T_j}t + \phi_0^j - \Delta\phi^j(t) \quad [\text{rad}] \quad (10)$$

$$\phi^k(t) = \frac{2\pi}{T_k}t + \phi_0^k - \Delta\phi^k(t) \quad [\text{rad}] \quad (11)$$

The estimation method for the instantaneous phase in the clock signals will be explained later. When $\Delta\phi(t)=0$ is used in equations (10) and (11), the instantaneous linear phase in the jitter-free clock signals are obtained as follows:

$$\phi^j_{linear}(t) = \frac{2\pi}{T_j}t + \phi_0^j \quad [\text{rad}] \quad (12)$$

$$\phi^k_{linear}(t) = \frac{2\pi}{T_k}t + \phi_0^k \quad [\text{rad}] \quad (13)$$

Here, the ideal rising edge times $t=(nT)_j$ and $t=(nT)_k$ of the signals $CLK_j$ and $CLK_k$ are the times where the instantaneous linear phase becomes $(2n\pi-\pi/2)$, and have the following relationship from equations (12) and (13):

$$(nT)_j = \left(2n\pi - \frac{\pi}{2} - \phi_0^j\right)\frac{T_j}{2\pi} \quad [\text{sec}] \quad (14)$$

$$(nT)_k = \left(2n\pi - \frac{\pi}{2} - \phi_0^k\right)\frac{T_k}{2\pi} \quad [\text{sec}] \quad (15)$$

Therefore, per equation (7), the following deterministic clock skew value is obtained:

$$\tau_{Skew}^{j,k} = (nT)_k - (nT)_j \quad (16)$$
$$= \left(2n\pi - \frac{\pi}{2} - \phi_0^k\right)\frac{T_k}{2\pi} - \left(2n\pi - \frac{\pi}{2} - \phi_0^j\right)\frac{T_j}{2\pi}$$
$$= \phi_0^j\left(\frac{T_j}{2\pi}\right) - \phi_0^k\left(\frac{T_k}{2\pi}\right) = (\phi_0^j - \phi_0^k)\frac{T_0}{2\pi} \quad [\text{sec}]$$

In general, the fundamental periods of the distributed clock signals $CLK_j$ and $CLK_k$ are the same with one another ($T_j=T_k$). In other words, the deterministic clock skew value between the two signals under test can be determined as a difference between the initial phase angles in the instantaneous linear phase of those two signals under test.

Here, the initial phase angle $\phi_0$ of the signals under test can be obtained by conducting a linear line fitting for the instantaneous phase waveform data $\phi(k)$ based on the minimum square method and choosing the formula below in such a way that $\phi_0$ becomes the minimum:

$$\sum_{k=1}^{N}\left(\phi(k) - (\hat{\omega}_0 k + \hat{\phi}_0)\right)^2 \quad (17)$$

Here, the initial phase angle to be determined is expressed as follows:

$$\hat{\phi}_0 = \frac{2N(2N+1)\sum_{k=1}^{N}\phi(k) - 6\sum_{k=1}^{N}k\phi(k)}{N(N-1)} \quad (18)$$

The estimation of parameters based on the linear line fitting is described, for example, page 362 of J. S. Bendat and A. G. Piersol "*Random Data: Analysis and Measurement Procedure*", 2$^{nd}$ edition, published by John Wiley & Sons, Inc. in 1986.

Further, the initial phase angle $\phi_0$ of signal x(t) under test can be obtained by conducting a cosine wave fitting for the clock waveform data x(k) or fundamental sine wave component based on the minimum square method in the following equation in such a way that $\phi_0$ becomes the minimum through the maximum likelihood estimation method:

$$\sum_{k=1}^{N}\left(x(k) - A \cos\left(\frac{2\pi}{T}k + \hat{\phi}_0\right)\right)^2 \quad (19)$$

Here, the initial phase angle to be determined is expressed as follows:

$$\hat{\phi}_0 = -\arctan\left(\frac{\sum_{k=1}^{N} x(k)\sin\frac{2\pi}{T}k}{\sum_{k=1}^{N} x(k)\cos\frac{2\pi}{T}k}\right) \quad (20)$$

The estimation of the parameter based on the maximum likelihood estimation is described, for example, pages 167-172 of S. M. Kay "*Fundamentals of statistical Signal Processing: Estimation Theory*", published by Prentice-Hall, Inc. in 1993.

In the foregoing, it is assumed that the clock edges corresponding to the two signals under test are separated no more than one clock period from one another. When the corresponding clock edges are separated more than one period, the deterministic clock skew value is determined by the difference between the initial phase angles and by the sum of the offset times of those clock edges.

$$\tau_{Skew}^{j,k} = (\phi_0^j - \phi_0^k)\frac{T_0}{2\pi} + n_{offset}T_0 \quad [\text{sec}] \quad (21)$$

The clock signal distributed from the clock signal source has a close relationship with the clock signal source. As a result, the phase noise (timing jitter sequences) in the distributed clock signals generally show a similar trend with the phase noise (timing jitter sequences) in the clock signal source. Due to this, the timing jitter sequences of the plural clock signals distributed from the same clock signal source both show similar characteristics to one another (see FIGS. 5A and 5B). Therefore, the offset amount $n_{offset}$ in the clock edges corresponding to the two signals under test can be determined by the correlation between the timing jitter sequences through estimation by finding an offset position where the correlation value is the largest. The offset amount $n_{offset}$ in the above clock edges can also be determined based on the offset position where the correlation value of the instantaneous phase noise becomes the largest.

In addition, the deterministic clock skew can be found by determining the zero-crossing timing of each signal under test and calculating the average value of the time difference between the corresponding zero-crossings.

Figure 4:
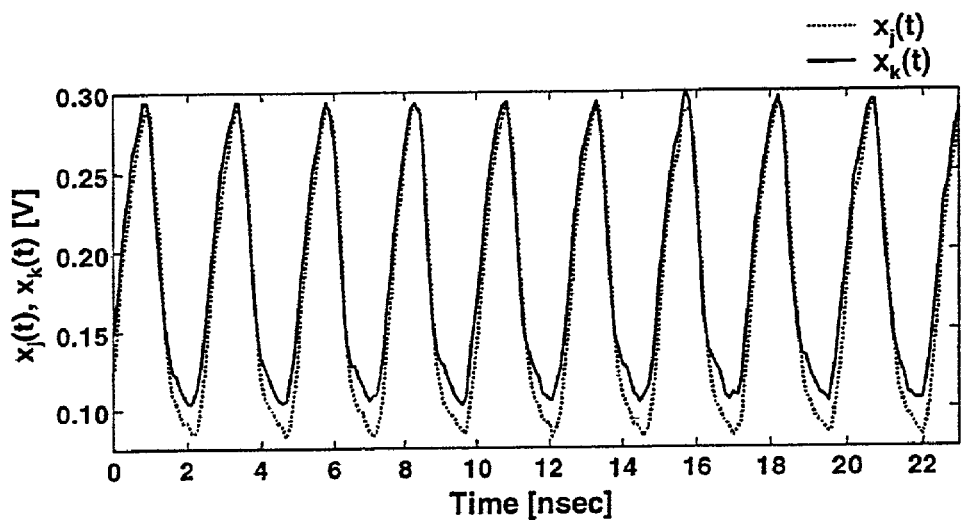
FIG. 4 is a diagram showing an example of waveforms of the clock signal under test.
Figure 5A:
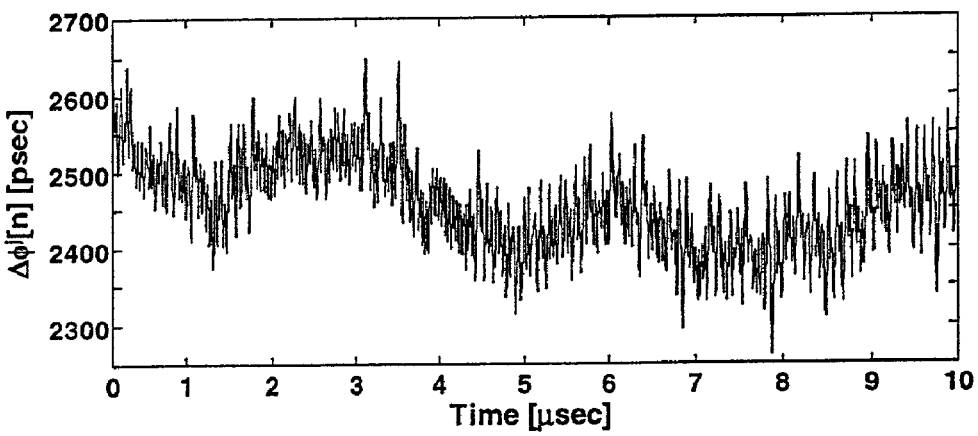
FIG. 5A is a diagram showing an example of timing jitter $\Delta\phi^j[n]$ of the clock signal $x_j(t)$ under test.
Figure 5B:
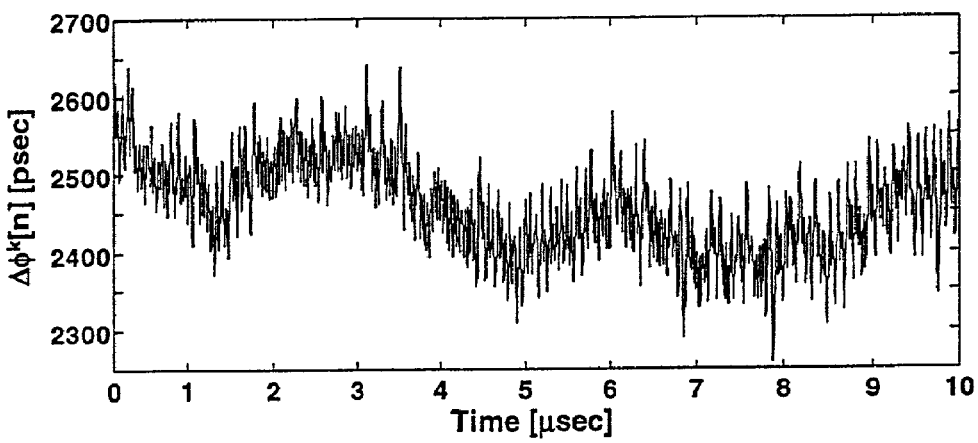
FIG. 5B is a diagram showing an example of timing jitter $\Delta\phi^k[n]$ of the clock signal $x_k(t)$ under test.
Figure 6:
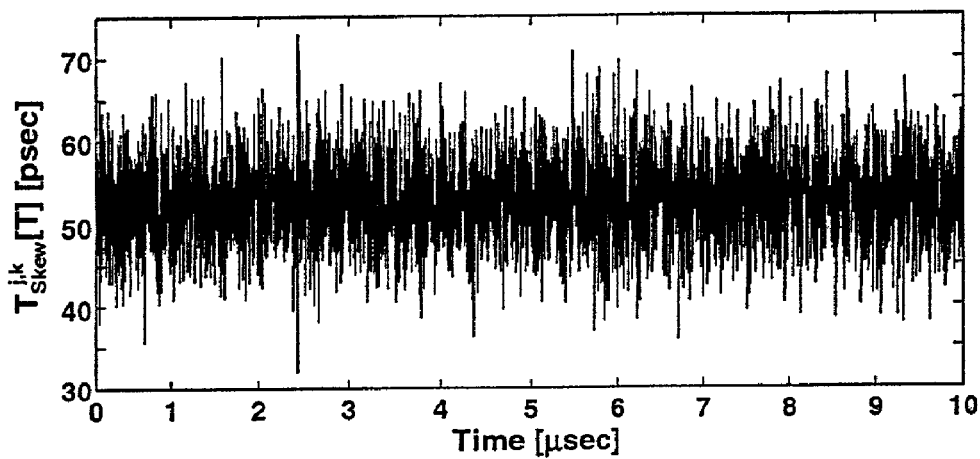
FIG. 6 is a diagram showing an example of clock skew between the clock signals under test measured by the clock skew measurement method of the present invention.

The clock skew estimation method of the present invention first determines the timing jitters $\Delta\phi^j[n]$ and $\Delta\phi^k[n]$ of the two signals $x_j(t)$, $x_k(t)$ under test as shown in FIG. 4. The determined timing jitter waveforms $\Delta\phi^j[n]$ and $\Delta\phi^k[n]$ are shown in FIGS. 5A and 5B respectively. Next, the deterministic skew value $\tau^{j,k}_{Skew}$ between the two signals $x_j(t)$, $x_k(t)$ under test is determined. Then, the timing difference of the clock edges are determined by calculating the difference between the timing jitters $\Delta\phi^j[n]$ and $\Delta\phi^k[n]$ so that the random components of the clock skew between signals $x_j(t)$, $x_k(t)$ under test can be determined. By calculating the sum of the random components and deterministic components in the clock skew, the clock skew $T^{j,k}_{Skew}[n]$ between the signals under test can be determined. The determined clock skew $T^{j,k}_{Skew}[n]$ is shown in FIG. 6.

Next, the RMS value and the peak-to-peak value in the clock skew will be measured from the clock skew sequence $T^{j,k}_{Skew}[n]$. The RMS value $T^{j,k}_{Skew,RMS}$ of the clock skew is the standard deviation for clock skew $T^{j,k}_{Skew}[n]$, and is determined by the following equation:

$$T^{j,k}_{Skew,RMS} = \sqrt{\frac{1}{N}\sum_{n=1}^{N}\left(T^{j,k}_{Skew}[n] - \overline{T}^{j,k}_{Skew}\right)^2} \quad [\text{sec}] \quad (22)$$

Here, N is a number of samples of the measured clock skew data. Also, the peak-to-peak value $T^{j,k}_{Skew,PP}$ of the clock skew is a difference between the maximum and minimum value of $T^{j,k}_{Skew}[n]$, and is determined by the following equation:

$$T^{j,k}_{Skew,PP} = \max_n\left(T^{j,k}_{Skew}[k]\right) - \min_n\left(T^{j,k}_{Skew}[k]\right) \quad [\text{sec}] \quad (23)$$

Figure 7:
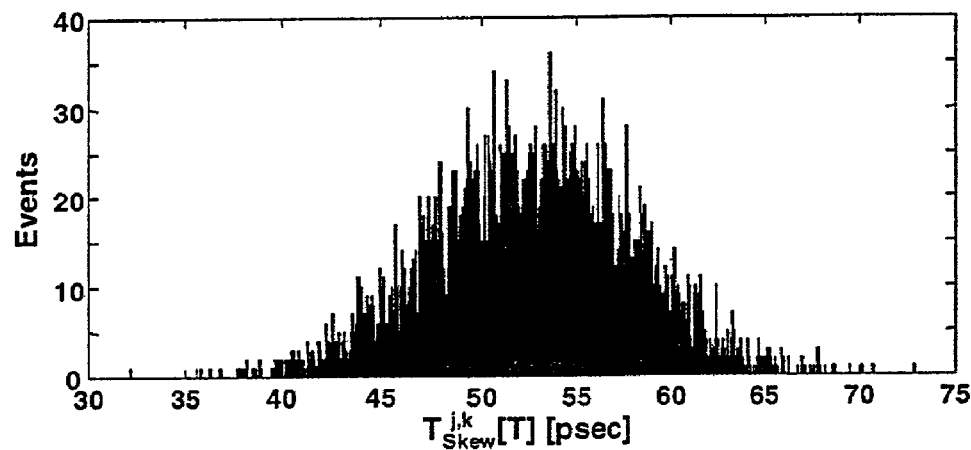
FIG. 7 is a diagram showing an example of histogram of the clock skew between the clock signals under test measured by the clock skew measurement method of the present invention.

FIG. 7 shows the histogram of the clock skew measured by this clock skew measurement method.

Figure 8:
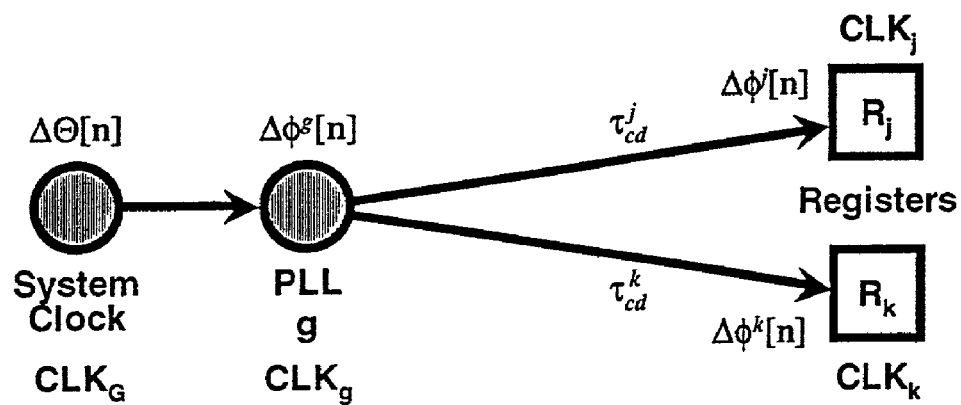
FIG. 8 is a schematic diagram showing a clock distribution network with different clock domains.
Figure 9:
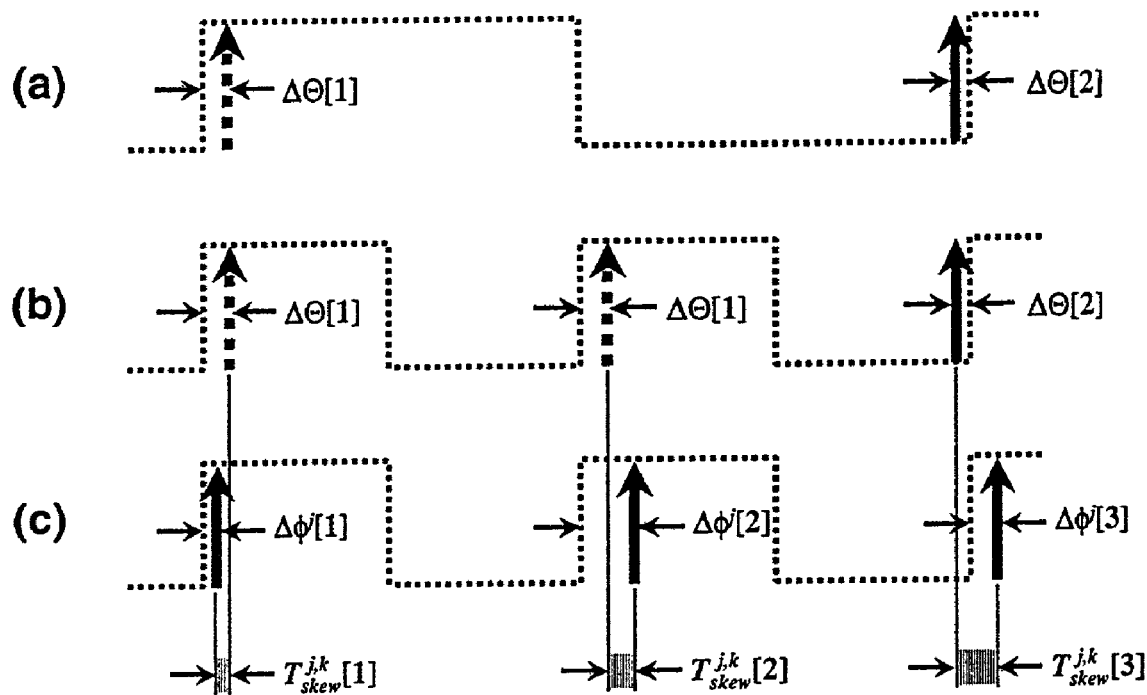
FIG. 9 is a schematic diagram showing a principle of clock skew measurement of the present invention involving frequency multiplication.

This clock skew estimation method can also measure the clock skews between the clock signals with different frequencies. Here, the clock distribution network shown in FIG. 8 is considered. The clock source $PLL_g$ multiplies the system clock $CLK_G$ provided from an external source by M times and distributes the clocks $CLK_j$ and $CLK_k$ to the network. FIG. 9(a) shows the system clock $CLK_G$, and FIG. 9(c) shows the multiplied clock $CLK_j$. The $\Delta\theta[1]$ [rad] of the system clock $CLK_G$ indicates the timing fluctuation between the edge and the ideal clock edge. Therefore, as shown in FIG. 9(b), assuming that the ideal clock edge is multiplied by M times, $\Delta\theta[\lfloor n/M \rfloor]$ and $\Delta\phi^j[n]$ become 1:1 when $\Delta\theta[1]$ is copied by M-1 times. Here, the $\lfloor x \rfloor$ indicates a maximum integer where it does not exceed x. By calculating the clock skew between $CLK_j$ and $CLK_G$ with equation (6), equation (24) is obtained as follows:

$$T^{G,j}_{Skew}[n] = \tau^{G,j}_{Skew} + \left[\Delta\phi^j[n]\left(\frac{T_j}{2\pi}\right) - \Delta\theta\left[\left\lfloor\frac{n}{M}\right\rfloor\right]\left(\frac{T_G}{2\pi}\right)\right] \quad [\text{sec}] \quad (24)$$

The deterministic clock skew value $\tau^{G,j}_{Skew}$ between the clocks $CLK_j$ and $CLK_G$ is expressed as the time difference between the ideal clock edge $(nMT)_j$ of the clock $CLK_j$ and the ideal clock edge $(nMT)_G$ of the system clock $CLK_G$, and can be determined from the initial phase angle of each clock signal as follows:

$$\tau^{G,j}_{Skew} = (nMT)_j - (nMT)_G \quad (25)$$

-continued $$= \phi_0^G\left(\frac{T_G}{2\pi}\right) - \phi_0^j\left(\frac{T_j}{2\pi}\right) = \phi_0^G\left(\frac{MT_0}{2\pi}\right) - \phi_0^j\left(\frac{T_0}{2\pi}\right) \quad [\text{sec}]$$

Here, since the clock $CLK_j$ is a clock which is multiplied the system clock $CLK_G$ by M times, the fundamental period $T_G$ of the system clock $CLK_G$ is equivalent to M times of the fundamental period $T_j$ of $CLK_j(T_G=MT_j)$.

In addition, by using an apparatus capable of measuring two channels at the same time to first sample $CLK_j$ and $CLK_g$ then sample $CLK_k$ and $CLK_g$, this clock skew measurement method can measure the clock skew between $CLK_j$ and $CLK_k$.

First, the clocks $CLK_j$ and $CLK_g$ are sampled at the same time to determine the skew of the clocks $CLK_j$ and $CLK_g$ by using equation (6):

$$T_{Skew}^{g,j}[n] = \tau_{Skew}^{g,j} + \left[\Delta\phi^j[n]\left(\frac{T_j}{2\pi}\right) - \Delta\phi^g[n]\left(\frac{T_g}{2\pi}\right)\right] \quad [\text{sec}] \tag{26}$$

Next, the clocks $CLK_k$ and $CLK_g$ are sampled at the same time to determine the skew of the clocks $CLK_k$ and $CLK_g$ in a similar manner:

$$T_{Skew}^{g,k}[n] = \tau_{Skew}^{g,k} + \left[\Delta\phi^k[n]\left(\frac{T_k}{2\pi}\right) - \Delta\phi^g[n]\left(\frac{T_g}{2\pi}\right)\right] \quad [\text{sec}] \tag{27}$$

Lastly, by determining the difference between the clock skew sequences calculated above, the clock skew between $CLK_j$ and $CLK_k$ can be obtained:

$$\begin{aligned}T_{Skew}^{j,k}[n] &= T_{Skew}^{g,k}[n] - T_{Skew}^{g,j}[n] \\ &= \left\{\tau_{Skew}^{g,k} + \left[\Delta\phi^k[n]\left(\frac{T_k}{2\pi}\right) - \Delta\phi^g[n]\left(\frac{T_g}{2\pi}\right)\right]\right\} - \\ &\quad \left\{\tau_{Skew}^{g,j} + \left[\Delta\phi^j[n]\left(\frac{T_j}{2\pi}\right) - \Delta\phi^g[n]\left(\frac{T_g}{2\pi}\right)\right]\right\} \\ &= (\tau_{Skew}^{g,k} - \tau_{Skew}^{g,j}) + \left\{\left[\Delta\phi^k[n]\left(\frac{T_k}{2\pi}\right) - \Delta\phi^g[n]\left(\frac{T_g}{2\pi}\right)\right] - \right. \\ &\quad \left.\left[\Delta\phi^j[n]\left(\frac{T_j}{2\pi}\right) - \Delta\phi^g[n]\left(\frac{T_g}{2\pi}\right)\right]\right\} \quad [\text{sec}]\end{aligned} \tag{28}$$

This clock skew measurement method can not only estimate the clock skews between the distributed MPU clock signals mentioned above, but it can also be applied to estimate the clock skews of other signals.

Next, the probability estimating method for peak-to-peak clock skews in the present invention will be explained.

Figure 10:
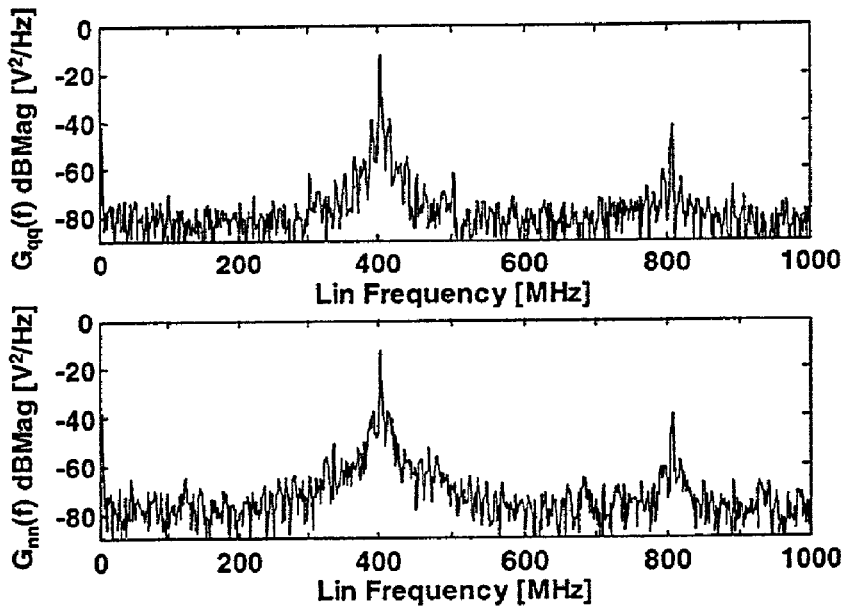
FIG. 10 is a diagram showing an example of power spectra of a clock signal in a microprocessor.
Figure 11:
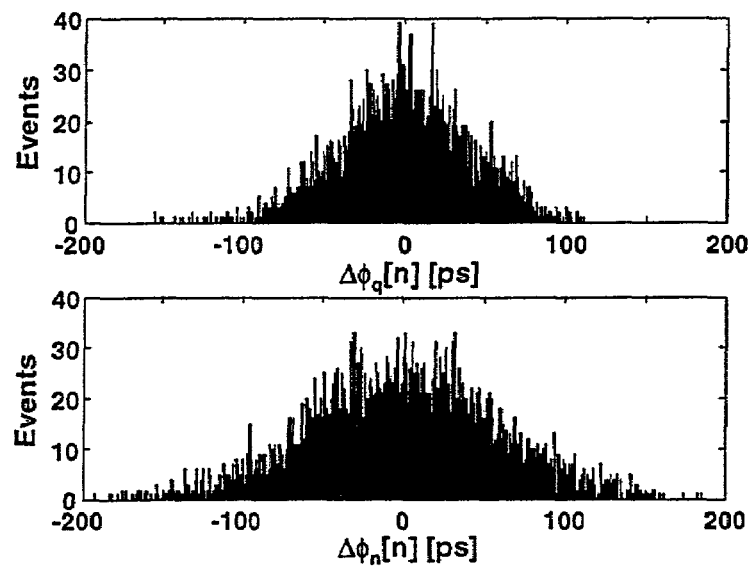
FIG. 11 is a diagram showing an example of timing jitter histogram of a clock signal in a microprocessor.

FIG. 10 shows the power spectra determined by using the Fast Fourier Transform on the clock waveform of the microprocessor. The upper diagram shows the quiet mode in the microprocessor, namely the power spectra in an inactive state of the microprocessor, and the lower diagram shows the noise mode in the microprocessor, namely the power spectra in an active state of the microprocessor. In the quiet mode, only the PLL (phase-locked loop) circuit operates to output the clock signals, and is in the condition where the clocks are not affected by surrounding circuit operations. In the noise mode, all of the L2 (level 2) memories, system bus, core bus, and branch prediction units in the microprocessor operate, and is in the condition where the clock is heavily affected by the surrounding circuit operations. In either conditions, the line spectrum in the clocks is observed at 400 MHz where the random instantaneous phase noise is seen in a nearby frequency band with respect to the center frequency 400 MHz. This indicates the existence of narrow-band random data. In addition, the probability density function of the timing jitters in the above clock signals is in a Gaussian distribution as shown in FIG. 11. Therefore, the timing jitter sequences in the clock signals is a Gaussian-based random process.

As mentioned above, the clock skew $T^{j,k}_{skew}$ between the two clock signals is expressed as follows, $$T_{Skew}^{j,k}[n] = \tau_{Skew}^{j,k} + \left[\Delta\phi^k[n]\left(\frac{T_k}{2\pi}\right) - \Delta\phi^j[n]\left(\frac{T_j}{2\pi}\right)\right] \quad [\text{sec}] \tag{29}$$

and their random component $T^{j,k}_{RS}$ is expressed as the difference between the timing jitter sequences as follows:

$$T_{RS}^{j,k}[n] = \Delta\phi^k[n]\left(\frac{T_k}{2\pi}\right) - \Delta\phi^j[n]\left(\frac{T_j}{2\pi}\right) \quad [\text{sec}] \tag{30}$$

Therefore, when the probability density function of the timing jitters $\Delta\phi^j[n]$ and $\Delta\phi^k[n]$ in each clock signal shows an average value 0 and a dispersion (variance) $\sigma$ in the Gaussian distribution, $$P_r(\Delta\phi) = \frac{1}{\sigma\sqrt{2\pi}}\exp\left(-\frac{\Delta\phi^2}{2\sigma^2}\right) \tag{31}$$

the probability density function of $T^{j,k}_{RS}$ is expressed as the convolution, $$P_r(T_{RS}^{j,k}) = \int_{-\infty}^{\infty} \frac{1}{\sigma\sqrt{2\pi}}\exp\left(-\frac{x^2}{2\sigma^2}\right)\frac{1}{\sigma\sqrt{2\pi}}\exp\left(-\frac{(t-x)^2}{2\sigma^2}\right)dx \tag{32}$$

where it becomes a Gaussis distribution by central limit theorem:

$$P_r(T_{RS}^{j,k}) = \frac{1}{2\sigma\sqrt{\pi}}\exp\left(-\frac{t^2}{4\sigma^2}\right) = \frac{1}{\hat{\sigma}\sqrt{2\pi}}\exp\left(-\frac{(T_{RS}^{j,k})^2}{2\hat{\sigma}^2}\right) \tag{33}$$

$$\hat{\sigma} = \sqrt{2}\sigma \tag{34}$$

In other words, the random component $T^{j,k}_{RS}$ in the clock skew is also a Gaussian-based random process.

In the narrow-band random process $\{Z[n]\}$, when a certain instantaneous value $Z[n]$ is subject to Gaussian distribution, the peak value collection, namely the maximum value collection of $Z[n]$ $\{\max(Z[n])\}$, becomes closer to Rayleigh distribution when the degrees of freedom n (number of sample) is made larger. This principle is described, for example, page 542 of J. S. Bendat and A. G. Piersol "Random Data: Analysis and Measurement Procedure", 2$^{nd}$ Edition, published by John Wiley & Sons, Inc. in 1986, or pages 90-92 of D. E. Newland "An Introduction to Random Vibrations, Spectral & Wavelet Analysis", published by Longman Scientific & Technical in 1993.

As explained above, by the existence of the random components $T^{j,k}_{RS}$ of the clock skew and that the random components $T^{j,k}_{RS}$ being subject to the Gaussian distribution, the peak value collection $\{Z_p\}=\{\max(T^{j,k}_{RS}[n])\}$ of the random components of the clock skew becomes subject to the Rayleigh distribution. The Rayleigh distribution is described on pages 30-31 of S. M. Kay "Fundamentals of Statistical Signal Processing: Detection Theory", published by Prentice-Hall, Inc. in 1998.

The probability density function $P_r(Z_p)$ of the Rayleigh distribution is known to be expressed by the following equation:

$$P_r(Z_p) = \frac{Z_p}{\sigma_z^2} \exp\left(-\frac{Z_p^2}{2\sigma_z^2}\right) \quad Z_p > 0 \qquad (35)$$
$$= 0 \qquad Z_p < 0$$

Figure 12:
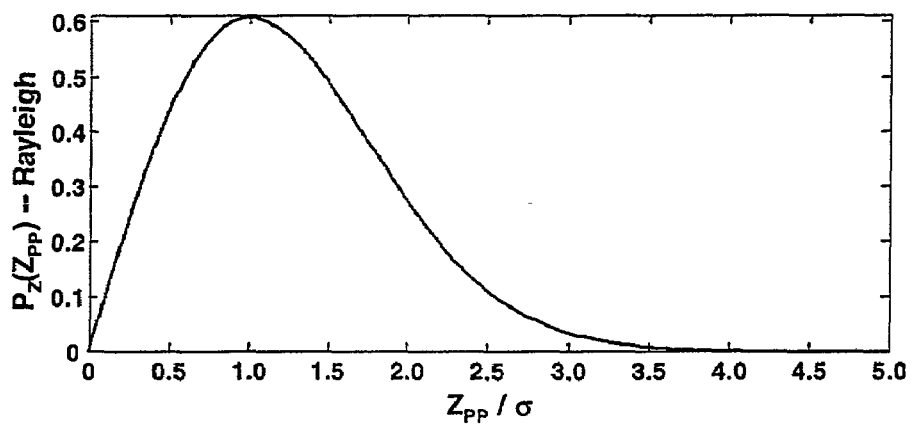
FIG. 12 is a diagram showing a probability density function of the Rayleigh distribution.

Here, $\sigma_z$ is an RMS value of clock skew $T^{j,k}_{RS}$, and $\sigma_z^2$ is dispersion. The Rayleigh probability density function is, as shown in FIG. 12, $P_r(Z_p) \neq 0$ when $Z_p > 0$.

Further, when the peak value $Z_p$ is subject to the Rayleigh distribution, the probability of $Z_p$ to become larger than a certain value $Z_{pk}$ is known to be expressed by the following equation (right-tail probability):

$$P(Z_p > \hat{Z}_{pk}) = \int_{\hat{Z}_{pk}}^{\infty} P(Z_p) dZ_p = \exp\left(-\frac{\hat{Z}_{pk}^2}{2\sigma_z^2}\right) \qquad (36)$$

Also, the standard deviation of $Z_{pk}$ is expressed by the following equation:

$$\sigma_{z_{pk}} = \sqrt{\frac{4-\pi}{2}} \sigma_z \qquad (37)$$

Figure 13:
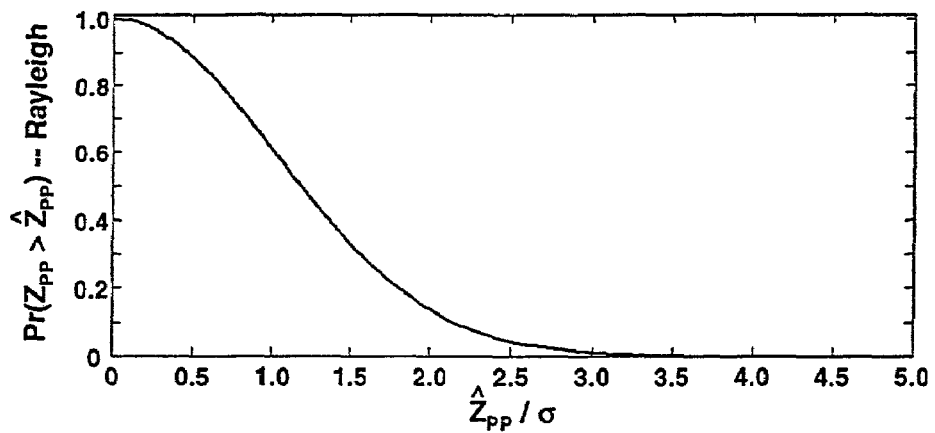
FIG. 13 is a diagram showing a right-tail probability of the Rayleigh distribution.

The probability $P_r(Z_p > Z_{pk})$ is shown in FIG. 13.

Therefore, by setting $Z_{pk}$ as the worst case peak value of the random components in the clock skew and measuring the root mean square $\sigma_z^2$ in the clock skew of the signal under test, the probability of the random components in the clock skew of the signal under test that exceeds the worst case peak value $Z_{pk}$ can be estimated, where the reliability of that clock distribution network becomes higher as the probability becomes lower.

Based on the consideration described above, the probability estimating method for peak-to-peak clock skews in the present invention determines the generation probability of the peak value in the clock skews between the signals under test.

Further, by removing the low frequency components from the instantaneous phase noise, the probability density function in the timing jitters can become closer to the Gaussian distribution, thereby improving the accuracy in the probability estimation.

Also, when the probability for peak value $Z_p$ of the timing jitter of the input signal that exceeds the peak value $Z_{pk}$ is given by the equation (35), the probability for the peak-to-peak value $J_{PP}$ of the jitter that exceeds $Z_{PP}$ as shown below can be obtained from the product of the probability for positive peak value $Z_p^+$ to exceed $+Z_{PP}/2$, and the probability for negative peak value $Z_p^-$ that exceeds $-Z_{PP}/2$:

$$P_r(Z_{pp} > \hat{Z}_{pp}) = P_r\left(Z_p^+ > +\frac{\hat{Z}_{pp}}{2}\right) \cdot P_r\left(Z_p^- < -\frac{\hat{Z}_{pp}}{2}\right) \qquad (38)$$
$$= P_r\left(Z_p > \frac{\hat{Z}_{pp}}{2}\right) \cdot P_r\left(Z_p > \frac{\hat{Z}_{pp}}{2}\right)$$
$$= \exp\left(-\frac{\hat{Z}_{pp}^2}{8\sigma_z^2}\right) \exp\left(-\frac{\hat{Z}_{pp}^2}{8\sigma_z^2}\right) = \exp\left(-\frac{\hat{Z}_{pp}^2}{4\sigma_z^2}\right)$$

Based on the foregoing observation, the probability estimation method for peak-to-peak clock skews of the present invention determines the generation probability of the peak-to-peak value in the clock skews between the signals under test.

Figure 14:
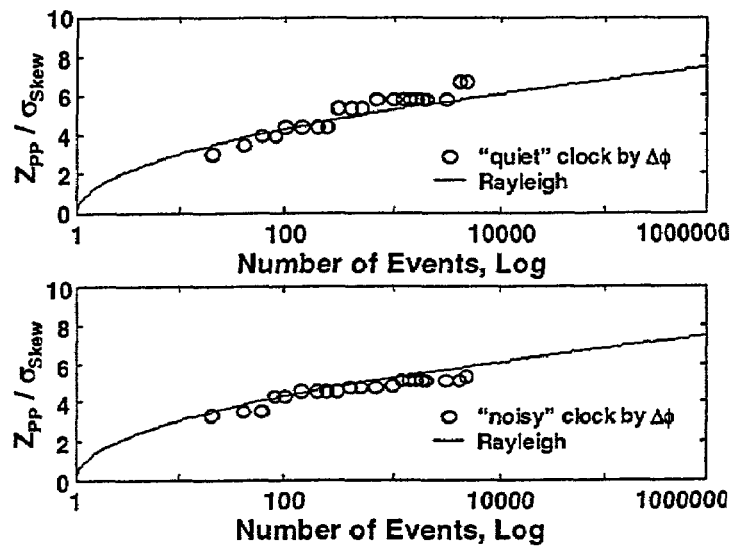
FIG. 14 is a diagram showing a relationship between the number of zero-crossing samples and the observed peak-to-peak clock skew values.

In FIG. 14, the samples and peak-to-peak values are plotted for the clock skews between the two signals under test, which have been distributed within the microprocessor. The upper diagram shows the test results in the quiet mode in the microprocessor, and the lower diagram shows the test results in the noise mode. The theoretical curve in the diagrams are calculated from the inverse probability $P_r(Z_{PP} > Z_{PP})$ expressed by the equation (38). The test data complies very well with the theoretical curves of the Rayleigh distribution (especially in the noise mode).

Next, the timing jitter estimation method of the present invention is described. A jitter-free clock signal is a square wave with a fundamental frequency $f_0$. These signals can be separated into harmonics frequencies including $f_0$, $3f_0$, $5f_0$ and so forth based on Fourier analysis. Since the jitter corresponds to the fluctuation of the fundamental frequency of the signal under test, only the signal components closest to the fundamental frequency will be considered in the jitter analysis.

The fundamental sinusoidal wave component in the clock signal (signal under test) with jitter is expressed as follows, where A represents an amplitude of the clock signal and $T_0$ represents the fundamental period of the clock signal:

$$x(t) = A \cos(\phi(t)) = A \cos\left(\frac{2\pi}{T_0} t + \phi_0 - \Delta\phi(t)\right) \qquad (39)$$

Here, $\phi(t)$ represents an instantaneous phase of the signal under test, and is expressed as a sum of the linear phase component $2\pi t/T_0$ having the fundamental period $T_0$, an initial phase angle $\phi_0$ (can be zero in the calculation), and the instantaneous phase noise component $\Delta\phi(t)$.

When the instantaneous phase noise component $\Delta\phi(t)$ is zero, an interval between the rising zero-crossing points of the signal under test is merely the constant period $T_0$. The non-zero instantaneous phase noise component $\Delta\phi(t)$ causes to fluctuate the zero-crossing points of the signal under test. In other words, $\Delta\phi(nT_0)$ in the zero-crossing point $nT_0$ indicates the time fluctuation of the zero-crossing points, and is called a timing jitter. Therefore, by estimating the instantaneous phase φ(t) of the signal under test and finding the difference between that instantaneous phase and linear phase in the zero-crossing points (which corresponds to the phase waveform of the ideal jitter-free clock signal), namely the instantaneous phase noise Δφ(t), the timing jitters in the signals under test can be determined.

Figure 15:
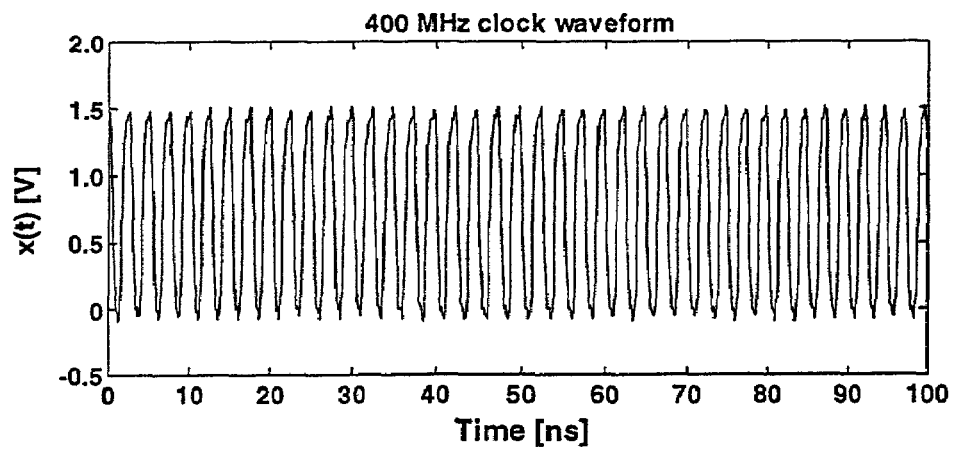
FIG. 15 is a diagram showing an example of waveform of the clock signal under test.
Figure 16:
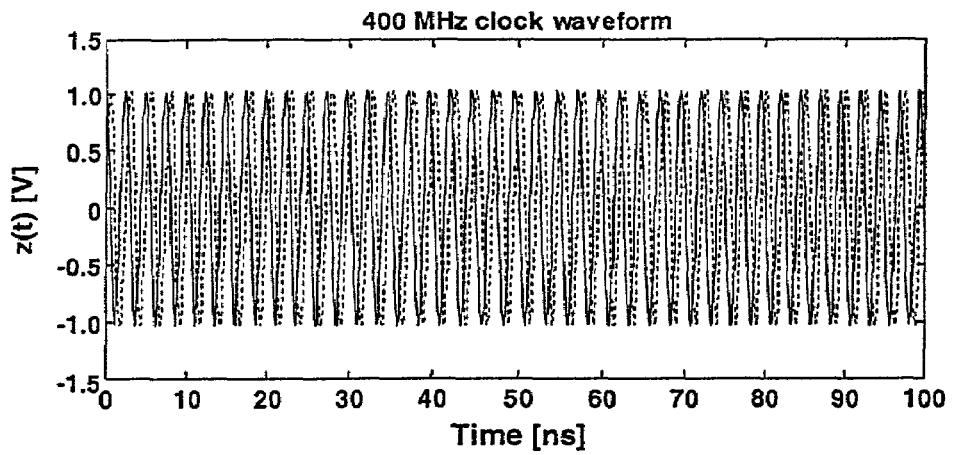
FIG. 16 is a diagram showing an example of waveform of an analytic signal of the clock signal under test.
Figure 17:
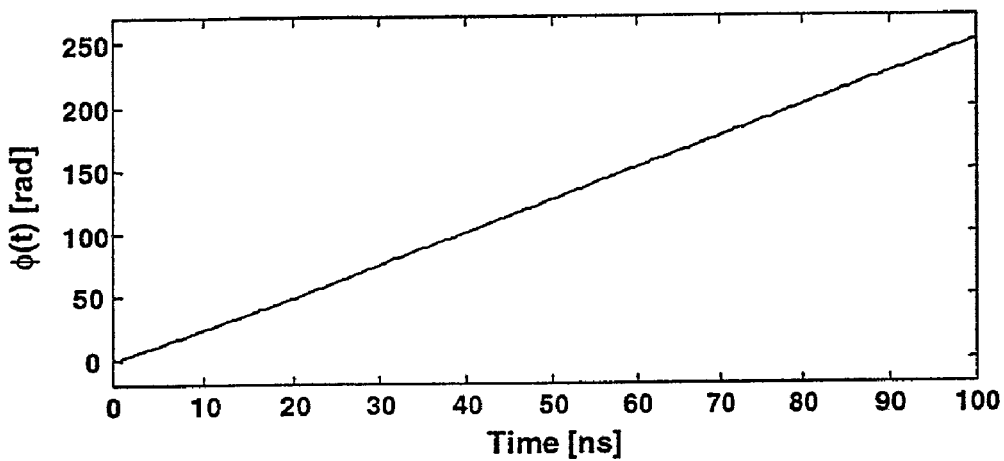
FIG. 17 is a diagram showing an example of waveform of the instantaneous phase of the clock signal under test.
Figure 18:
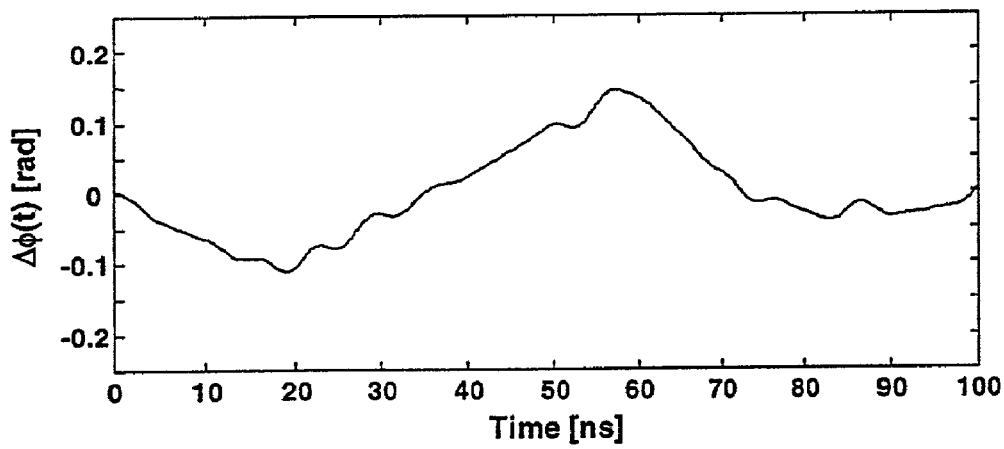
FIG. 18 is a diagram showing an example of waveform of the instantaneous phase noise of the clock signal under test.
Figure 19:
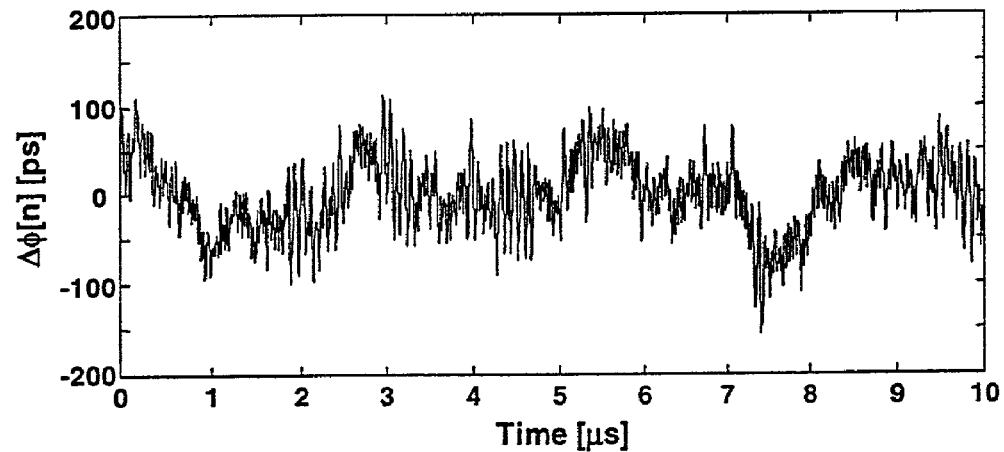
FIG. 19 is a diagram showing an example of waveform of the timing jitter of the clock signal under test.

First, the timing jitter estimation method of the present invention converts the signal x(t) under test shown in FIG. 15 into an analytic signal z(t) of a complex number. The converted analytic signal z(t) is shown in FIG. 16. In FIG. 16, the continuous line indicates the real part of the analytic signal and the broken line indicates the yimaginary part of the analytic signal. Next, an instantaneous phase φ(t) of the signal x(t) under test is estimated from the analytic signal z(t). The estimated instantaneous phase waveform φ(t) is shown in FIG. 17. Then, by conducting a linear line fitting for the instantaneous phase waveform data based on the minimum square method, and determining the linear phase φ$_{linear}$(t) corresponding to the instantaneous phase waveform in the ideal jitter-free signal, and calculating the difference between the instantaneous phase φ(t) and that linear phase φ$_{linear}$(t), the instantaneous phase noise Δφ(t) in the signal under test is determined. The instantaneous phase noise waveform Δφ(t) determined in this manner is shown in FIG. 18. Further, by sampling the instantaneous phase noise waveform Δφ(t) at a timing closest to each zero-crossing point (analogous zero-crossing point) in the real part x(t) of the analytic signal z(t), the instantaneous phase noise in the zero-crossing timing $nT_0$, namely the timing jitter Δφ[n] (=Δφ($nT_0$)), is estimated. The estimated timing jitter waveform Δφ[n] is shown in FIG. 19.

With the use of a waveform clipper, the timing jitter estimation method of the present invention can estimate the timing jitter with high accuracy by removing the AM (amplitude modulation) components from the signals under test and retaining only the PM (phase modulation) components corresponding to the jitter.

Also, by using means for removing low frequency components, the timing jitter estimation method of the present invention can remove the low frequency components from the instantaneous phase noise signals.

The method of estimating the instantaneous phase with use of the analytic signal is described here. The analytic signal z(t) of the real signal x(t) is defined by a complex signal in the following equation:

$$z(t) = x(t) + j\hat{x}(t) \quad (40)$$

Here, j is an imaginary unit, and an imaginary part x(t) of the complex signal z(t) is a Hilbert-transformation of the real part x(t).

Meanwhile, a Hilbert transformed time wavform x(t) is defined by the following equation:

$$\hat{x}(t) = H[x(t)] = \frac{1}{\pi} \int_{-\infty}^{+\infty} \frac{x(\tau)}{t - \tau} d\tau \quad (41)$$

Here, x(t) is the convolution of the function x(t) and (1/πf). In other words, the Hilbert transformation is equivalent to the x(t) that has passed through a band-pass filter. However, the spectra component in the output x(t) at this time will not change in the amplitude, but shift the phase by π/2.

The analytic signal and Hilbert transformation are described, for example, in A. Papoulis "*Probability Random Variables and Stochastic Processes*", $2^{nd}$ Edition, published by McGraw-Hill Book Company, 1984.

The instantaneous phase waveform φ(t) of the real signal x(t) is determined by using the following equation from the analytic signal z(t):

$$\phi(t) = \tan^{-1}\left[\frac{\hat{x}(t)}{x(t)}\right] \quad (42)$$

Figure 20:
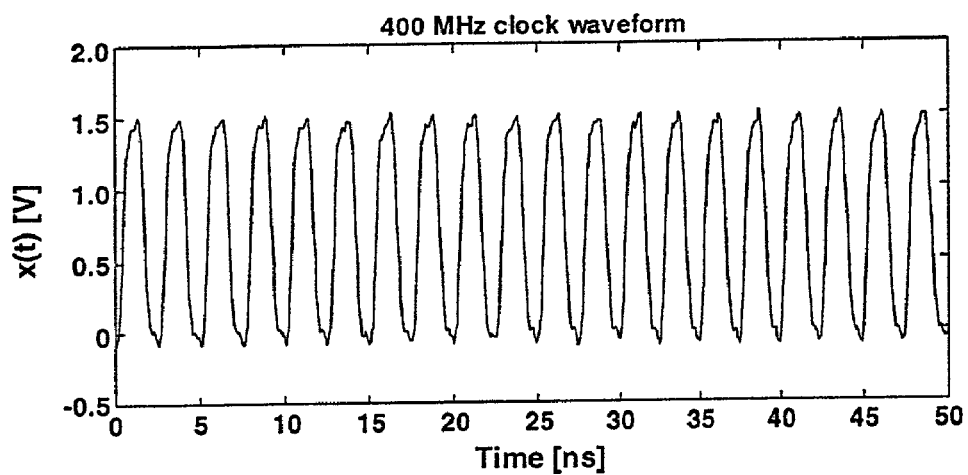
FIG. 20 is a diagram showing an example of waveform of the of clock signal under test.

Next, the algorithm for estimating the instantaneous phase with use of the Hilbert transformation is explained below. First, by applying the Hilbert transformation to the signal under test shown in FIG. 20

$$x(t) = A \cos\left(\frac{2\pi}{T_0}t + \phi_0 - \Delta\phi(t)\right) \quad (43)$$

and determining a signal corresponding to the imaginary part of the complex signal, $$\hat{x}(t) = H[x(t)] = A \sin\left(\frac{2\pi}{T_0}t + \phi_0 - \Delta\phi(t)\right) \quad (44)$$

the signal x(t) under test is transformed into an analytic signal in the equation (45):

$$z(t) = \quad (45)$$
$$x(t) + j\hat{x}(t) = A \cos\left(\frac{2\pi}{T_0}t + \phi_0 - \Delta\phi(t)\right) + jA \sin\left(\frac{2\pi}{T_0}t + \phi_0 - \Delta\phi(t)\right)$$

Figure 21:
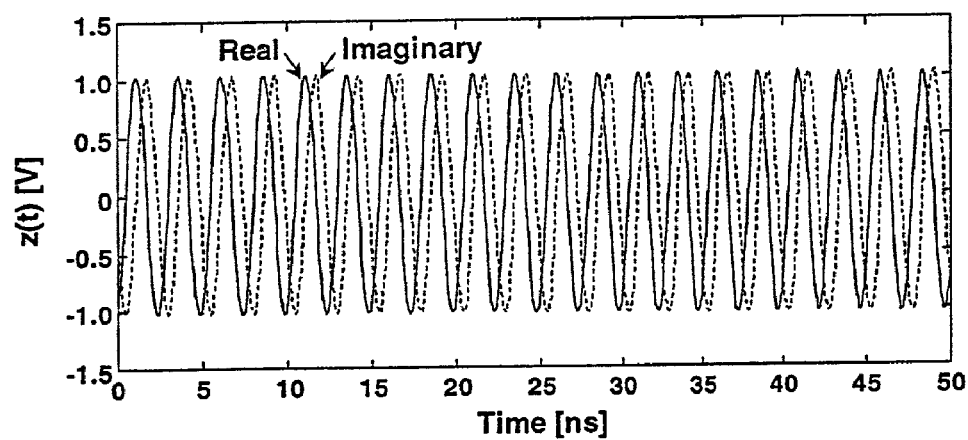
FIG. 21 is a diagram showing an example of waveform of the Hilbert transformed analytic signal.

The transformed analytic signal is shown in FIG. 21. Here, a band-pass filter process is applied to the obtained analytic signal. This is for handling only the signal components closest to the fundamental frequency of the signal under test in the jitter analysis because the jitter corresponds to the fluctuation of the fundamental frequency of the signal under test. Next, the phase function φ(t) is estimated by using equation (42) from the determined analytic signal z(t):

$$\phi(t) = \left[\frac{2\pi}{T_0}t + \phi_0 - \Delta\phi(t)\right] \bmod 2\pi \ [\text{rad}] \quad (46)$$

Figure 22:
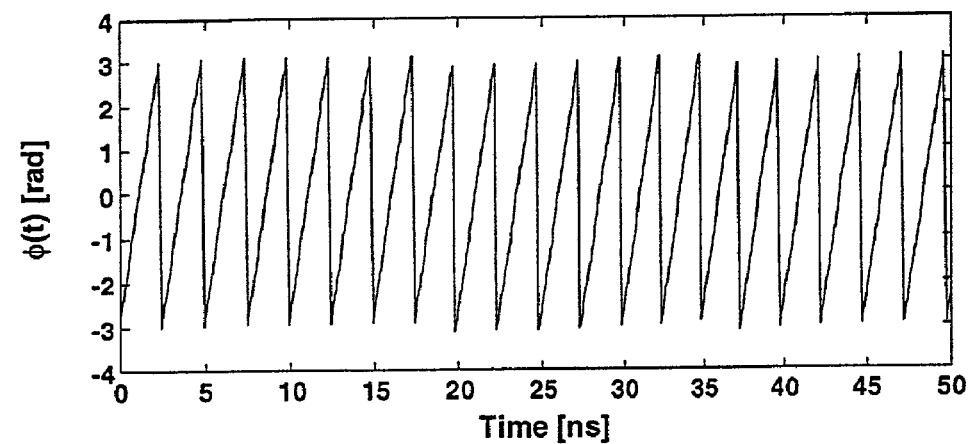
FIG. 22 is a diagram showing an example of instantaneous phase signal having a discontinuous instantaneous phase.

Here, φ(t) is expressed by using the principal value of a phase range between −π and +π, and carries discontinuous points near the conversion point from +π to −π. The estimated phase function φ(t) is shown in FIG. 22. Lastly, by unwrapping the discontinuous phase function φ(t) (namely, appropriately adding the integer multiple of 2π to the principal value φ(t)), the discontinuity can be removed to obtain the continuous instantaneous phase φ(t).

$$\phi(t) = \frac{2\pi}{T_0}t + \phi_0 - \Delta\phi(t) \ [\text{rad}] \quad (47)$$

Figure 23:
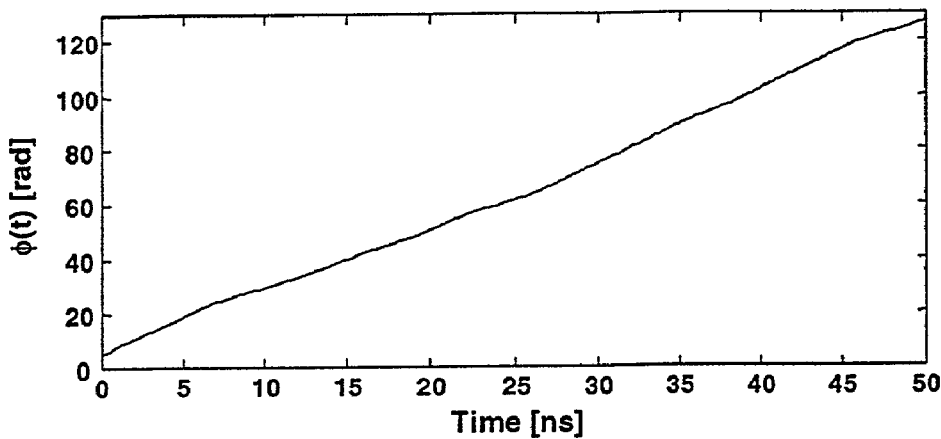
FIG. 23 is a diagram showing an example of continuous instantaneous phase signal that has been unwrapped.

The phase unwrapping method is described in Donald G. Childers, David P. Skinner, and Robert C. Kemerait "*The Cepstrum: A Guide to Processing*", volume 65, published by Proceedings of IEEE, 1977. The unwrapped continuous instantaneous phase function φ(t) is shown in FIG. 23.

The transformation from the real signal to the analytic signal can be fulfilled by a digital signal processing using Fast Fourier Transformation (FFT).

Figure 24:
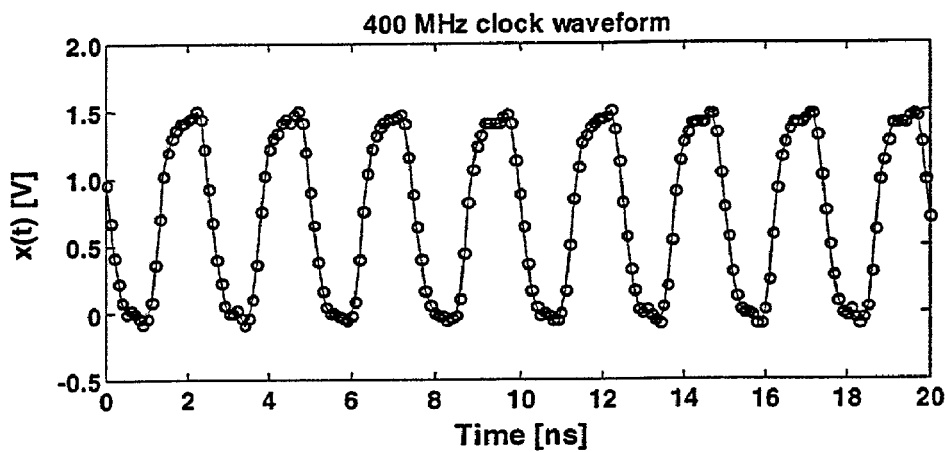
FIG. 24 is a diagram showing an example of digitized clock signal under test.
Figure 25:
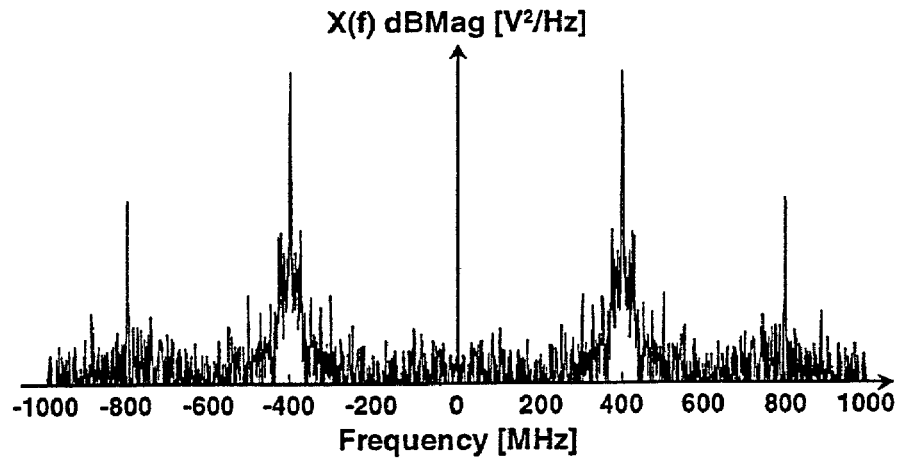
FIG. 25 is a diagram showing an example of both-side power spectra of the clock signal under test obtained through FFT.
Figure 26:
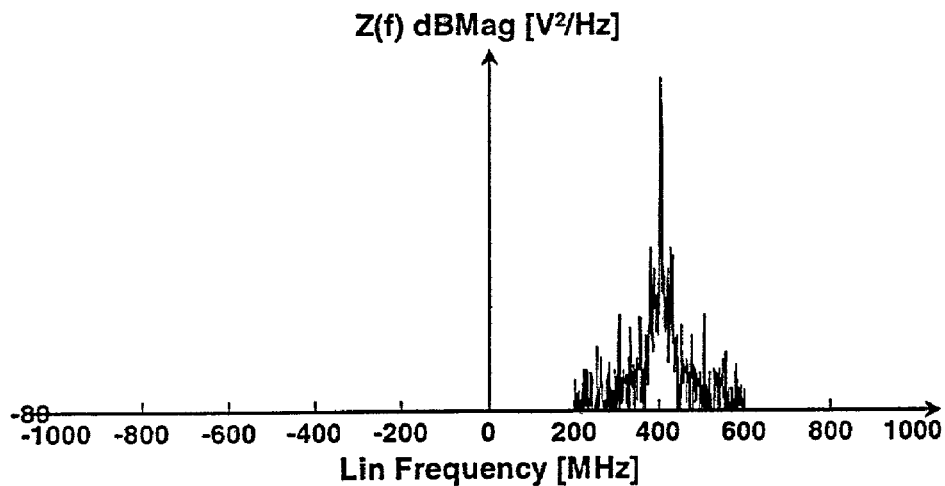
FIG. 26 is a diagram showing an example of one side of the band-limited power spectra of the clock signal.
Figure 27:
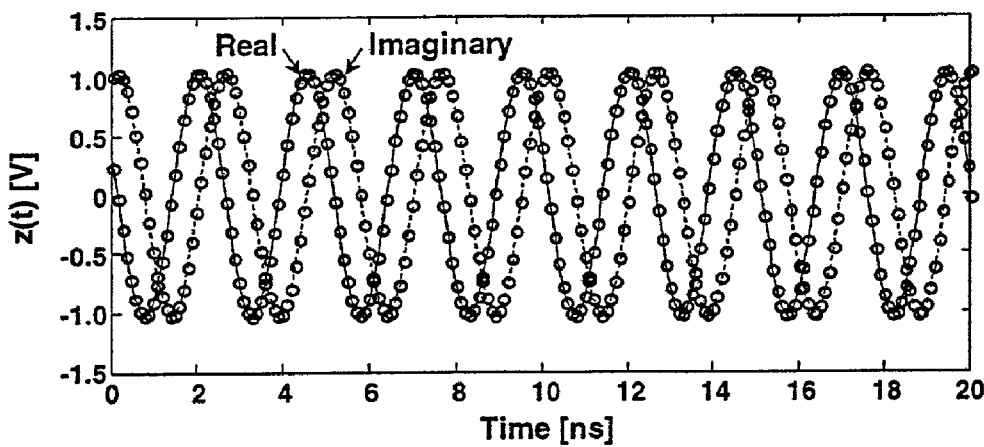
FIG. 27 is a diagram showing an example of band limited analytic signal derived through inverse FFT.

First, FFT is applied to the digitized signal x(t) under test as shown in FIG. 24 to obtain both-side power spectra (with positive and negative frequency) X(f) of the signal under test. The obtained both-side power spectra X(f) is shown in FIG. 25. Then, the entire data is emptied except for the data closest to the fundamental frequency from the positive frequency components of the spectra X(f), and doubles the positive frequency components. Such processes in the frequency domain corresponds to the band-limit process of the signal under test in the time domain to obtain the analytic signal. The obtained signal Z(f) in the frequency domain is shown in FIG. 26. Lastly, by applying an inverse FFT to the obtained signal Z(f), the band-limited analytic signal z(t) can be obtained. The band-limited analytic signal z(t) is shown in FIG. 27.

The analytic signal transformation using FFT is described, for example, in J. S. Bendat and A. G. Piersol "*Random Data: Analysis and Measurement Procedure*", 2$^{nd}$ Edition, published by John Wiley & Sons, Inc. in 1986.

Alternatively, when the instantaneous phase estimation is the object, the process of doubling the positive frequency component can be omitted.

Figure 28:
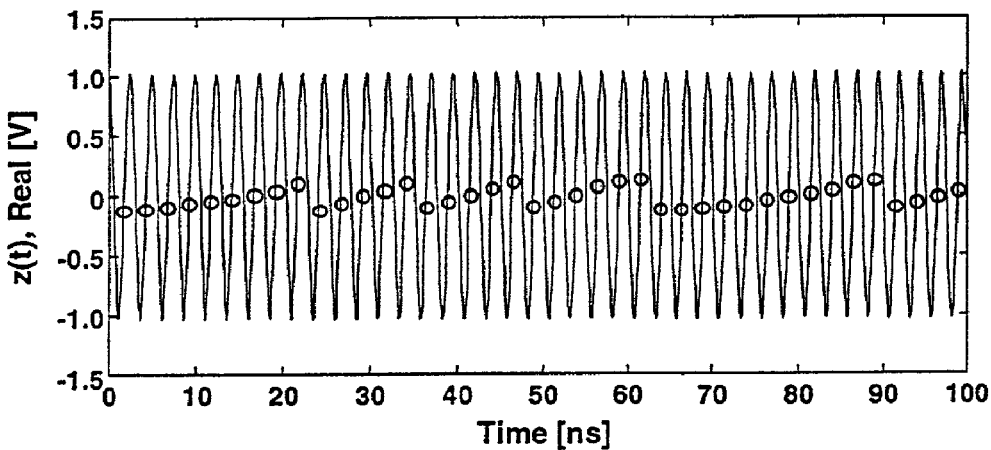
FIG. 28 is a diagram showing an example of adaptive zero-crossing points approximation of the clock signal under test.

Next, the detection method for the analogous zero-crossing points will be explained. First, a signal value $V_{50\%}$ at the 50% level of the analytic signal of the input signal to be tested is calculated as a zero-crossing level, where the maximum value for the real part x(t) of the analytic signal is at a 100% level thereof and the minimum value is at a 0% level thereof. Then, the difference between each adjacent sample value and the 50% level $V_{50\%}$, namely, $(x(j-1)-V_{50\%})$ and $(x(j)-V_{50\%})$ is calculated to further determine the product $(x(j-1)-V_{50\%}) \times (x(j)-V_{50\%})$. When x(t) is crossing the 50% level, namely the zero-crossing level, the symbol of the sampled values $(x(j-1)-V_{50\%})$, $(x(j)-V_{50\%})$ change from negative to positive or vice versa, therefore, when the above product is negative, it means that x(t) crosses the zero-crossing level, where a time j-1 or j whichever smaller in the absolute value of the sampled values $(x(j-1)-V_{50\%})$, $(x(j)-V_{50\%})$ at that point is determined as the analogous zero-crossing point. The waveform of the real part x(t) of the analytic signal is shown in FIG. 28. The circle marks in FIG. 28 show the points closest to the detected rising zero-crossing point (analogous zero-crossing point).

Figure 29:
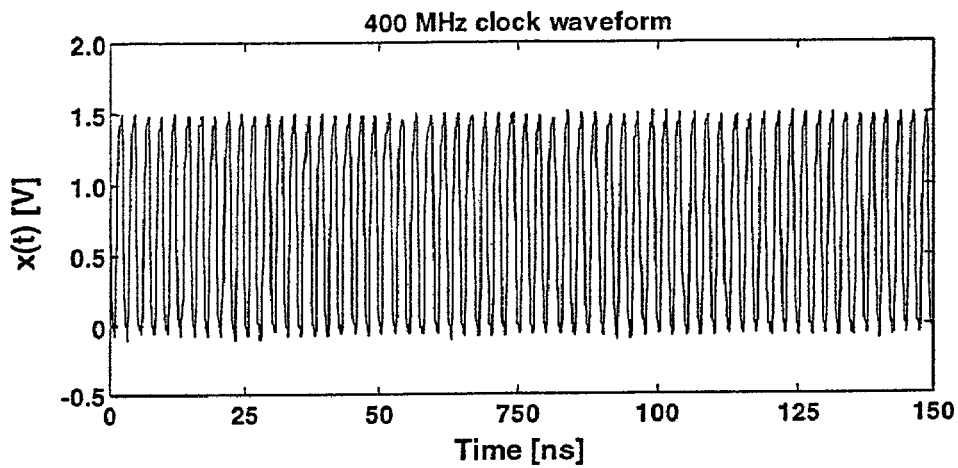
FIG. 29 is a diagram showing an example of clock signal under test having AM components.
Figure 30:
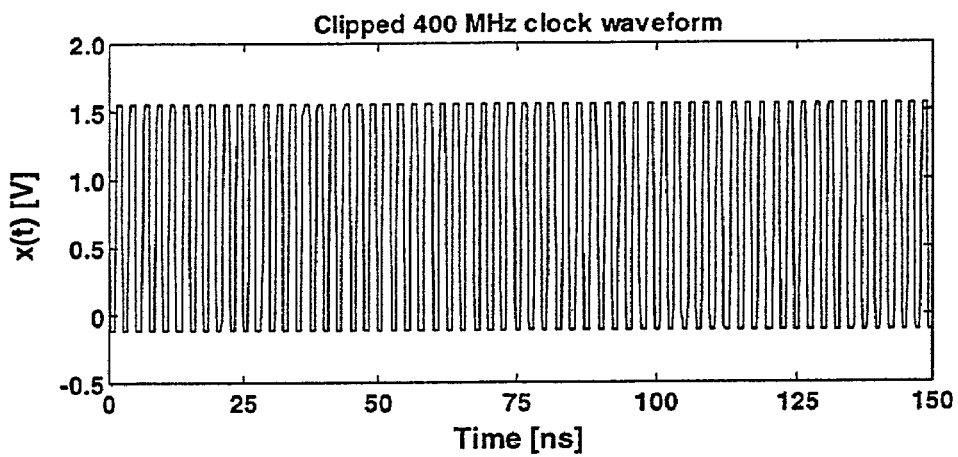
FIG. 30 is a diagram showing an example of clock signal under test without having AM components.

Waveform clipping means is able to remove the AM components from the input signal to retain only the PM components in the input signal corresponding to the jitters. The waveform clipping for the analog or digital input signal is conducted by (1) multiplying the signal value by a constant number, (2) replacing the signal value larger than the predetermined threshold value 1 with the threshold value 1, and (3) replacing the signal value smaller than the predetermined threshold value 2 with the threshold value 2. Here, the threshold value 1 is assumed to be larger than the threshold value 2. The clock signal with the AM component is shown in FIG. 29. From the fluctuation of the time waveform envelope in this drawing, the existence of the AM components is obvious. The clock signal clipped by the clipping means is shown in FIG. 30. Since the time waveform shows a constant envelope, the removal of the AM components can be confirmed.

The foregoing is the theoretical aspect of the present invention. Now the embodiments of the present invention will be explained below.

Figure 31:
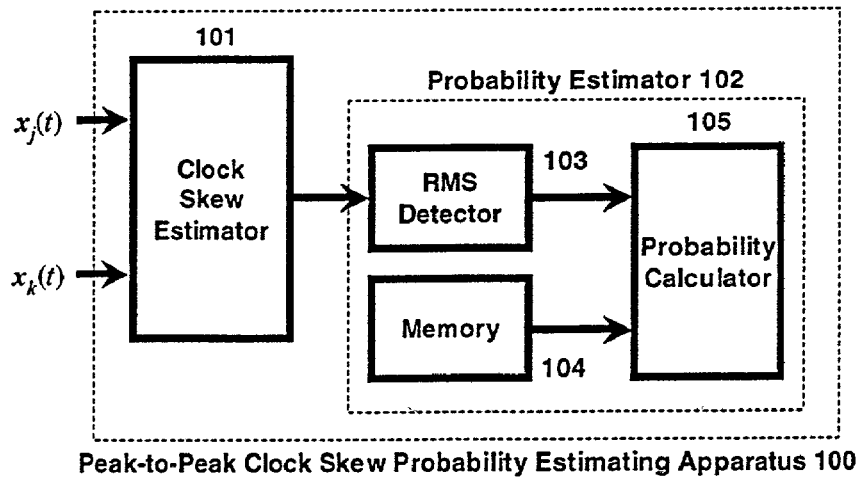
FIG. 31 is a diagram showing an example of structure in the apparatus for estimating the probability of peak-to-peak clock skews in the present invention.

FIG. 31 shows an example of structure in the probability estimating apparatus for peak-to-peak clock skews in the embodiment of the present invention. The probability estimating apparatus for peak-to-peak clock skews 100 is comprised of a clock skew estimator 101 for estimating the clock skew sequences between a plurality of clock signals under test, and a probability estimator 102 for determining and outputting the generation probability of the peak-to-peak value in the clock skews between the signals under test based on the clock skew sequences. Further, the probability estimator 102 is comprised of an RMS (root mean square) detector 103 for detecting the RMS value of the jitter waveforms supplied thereto, a memory 104 for storing a predetermined peak-to-peak value, and a probability calculator 105 for calculating the probability of the peak-to-peak jitters which exceeds the above predetermined value based on the predetermined peak-to-peak value and the detected RMS value. The clock skew estimator and its detailed configuration will be explained later.

Figure 32:
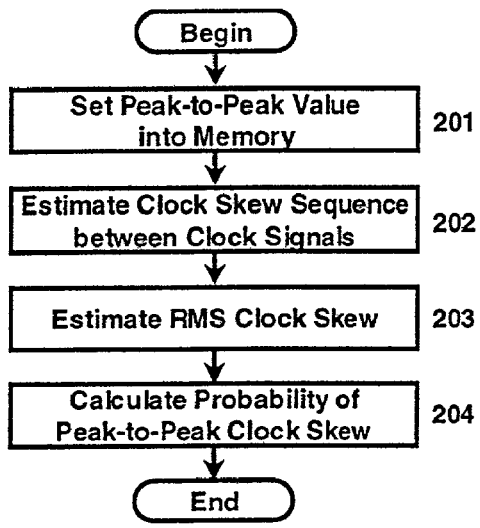
FIG. 32 is a flow chart showing an example of method for estimating the probability of peak-to-peak clock skews in the present invention.

Next, with use of the probability estimating apparatus for peak-to-peak clock skews 100 in the present invention, the operation to estimate the probability of the peak-to-peak clock skews between the plurality of clock signals under test that exceeds the predetermined value will be explained. FIG. 32 shows the operational procedure of the probability estimating method for peak-to-peak clock skews in the present invention. First, in step 201, the predetermined peak-to-peak value in the memory 104 is initialized. Next, in step 202, the clock skew estimator 101 estimates the clock skew sequences among the plurality of clock signals under test and supplies the estimated clock skew sequences to the probability estimator 102. Then, in step 203, the RMS detector 103 calculates the root mean square value in the clock skew sequences supplied from the clock skew estimator 101. Lastly, in step 204, the probability calculator 105 calculates the probability that the peak-to-peak value in the clock skews between the signals under test exceeds the above predetermined value with use of the peak-to-peak value stored in the memory 104 and the RMS value, and the process ends. In the step 204 noted above, the probability calculator 105 determines the probability of the peak-to-peak value in the clock skews exceeding the above predetermined value by using the equation (38), where the RMS value obtained from the step 203 is $\sigma_Z$ and the peak-to-peak value stored in the memory 104 is $Z_{PP}$.

Alternatively, the set value for determining the probability of the peak-to-peak value in the clock skews exceeding the predetermined value can be 2K times (K is constant) the RMS value of the clock skews. In this situation, instead of the memory 104, by providing a constant number multiplier for multiplying the RMS value $\sigma_Z$ obtained by the RMS detector 103 by 2K times, the obtained $2K\sigma_Z$ can be input to the probability calculator 105 as $Z_{PP}$.

The probability estimating apparatus for peak-to-peak clock skews shown in FIG. 31 can also be structured as an apparatus for determining the probability of the peak value of the clock skews exceeding the predetermined value. In this situation, the memory 104 stores the predetermined peak value, and the probability calculator 105 determines the probability of the peak value of the clock skews exceeding the predetermined value by using the equation (36).

Similarly, in the probability estimating method for peak-to-peak clock skews shown in FIG. 32, by replacing the step 204 for calculating the generation probability of the peak-to-peak value in the clock skews between the signals under test with a step of calculating the generation probability of the peak value in the clock skews, the peak value in the clock skews can be used in the procedure for determining the generation probability of the peak value in the clock skews exceeding the predetermined value.

Further, when determining the probability for the peak value in the clock skews exceeding the predetermined value, this predetermined value can be K times (K is constant) the RMS value in the clock skews. Under this condition, instead of the memory 104, by providing a constant number multiplier for multiplying the RMS value $\sigma_Z$ obtained by the RMS detector 103 by K times, the obtained $K\sigma_Z$ can be input to the probability calculator means 105 as the peak value $Z_{pk}$.

Figure 33:
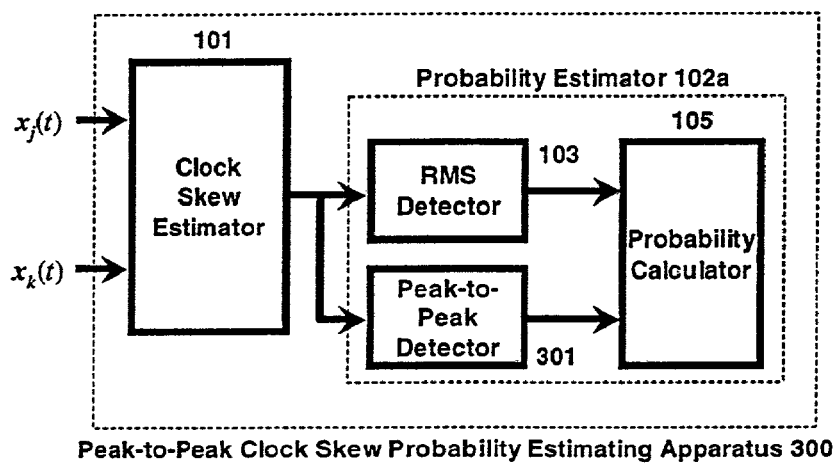
FIG. 33 is a diagram showing another example of structure in the apparatus for estimating the probability of peak-to-peak clock skews in the present invention.

Also, the probability estimating apparatus for peak-to-peak clock skews shown in FIG. 31 can be structured as an apparatus for determining the generation probability of the peak-to-peak value in the clock skews by changing the configuration of the probability estimator. FIG. 33 shows such an example of structure in the probability estimating apparatus for peak-to-peak clock skews used in another embodiment of the present invention. This probability estimating apparatus 300 for peak-to-peak clock skews in FIG. 33 is similar to the probability estimating apparatus for peak-to-peak clock skews shown in FIG. 31 except for the probability estimator 102 being replaced with a probability estimating apparatus 102a, where it is comprised of an RMS detector 103 for determining the RMS value of the clock skew sequences supplied thereto, a peak-to-peak detector 301 for determining the peak-to-peak value based on the supplied clock skew sequences, and a probability calculator 105 for calculating the probability of the clock skews between the signals under test exceeding the above peak-to-peak value based on the peak-to-peak value and the RMS value (for simplicity of explanation, descriptions for the duplicated parts are omitted).

Figure 34:
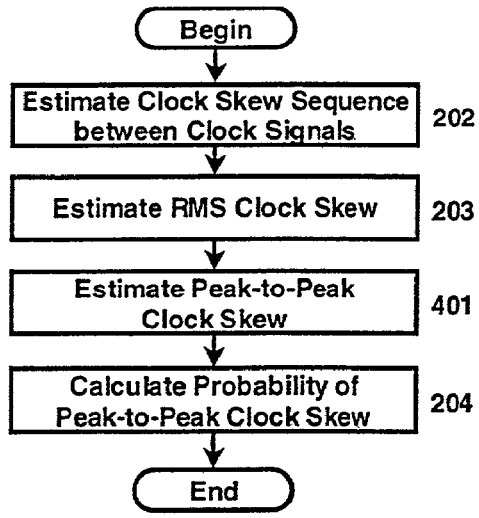
FIG. 34 is a flow chart showing another example of method for estimating the probability of peak-to-peak clock skews in the present invention.

Next, with use of the probability estimating apparatus for peak-to-peak clock skews 300 in the present invention, the operation for estimating the probability of the clock skews between the signals under test exceeding the peak-to-peak value will be explained. FIG. 34 shows such an operational procedure of the probability estimating method for peak-to-peak clock skews in the present invention. This probability estimating method for peak-to-peak clock skews is similar to the probability estimating method for peak-to-peak clock skews shown in FIG. 32 except for the removal of the step 201 for initializing the predetermined peak-to-peak value in the memory, and the addition of a step 401 in which, after the RMS value in the clock skew sequences between the signals under test is determined, the above noted peak-to-peak detector 301 calculates the difference between the maximum value and the minimum value in the clock skew sequences to determine the peak-to-peak value (for simplicity of explanation, descriptions for the duplicated parts are omitted). Here, in step 204, the probability calculator 105 determines the probability of the clock skews exceeding the peak-to-peak value by using the equation (38), where the RMS value obtained from the step 203 is $\sigma_Z$ and the peak-to-peak value also obtained from the above step 203 is $Z_{PP}$. Further, the step 203 for determining the RMS value in the above clock skew sequences and the step 401 for determining the peak-to-peak value are independent from one another, and can conduct the procedure in parallel or different order.

Also, the probability estimating apparatus for peak-to-peak clock skews shown in FIG. 33 can be structured as an apparatus for determining the generation probability of the peak value in the clock skews. In this situation, the probability calculator 105 determines the probability of the peak value in the clock skews exceeding the above noted predetermined value by using the equation (36), and the peak-to-peak detector 301 determines the maximum or minimum value in the clock skews.

Similarly, in the probability estimating method for peak-to-peak clock skews shown in FIG. 34, by replacing the step 204 for calculating the generation probability of the peak-to-peak value in the clock skews between the signals under test with a step of calculating the generation probability of the peak value in the clock skews, and by replacing the step 401 for determining the peak-to-peak value in the clock skews with a step for calculating the maximum or minimum value in the clock skew sequences to determine the peak value, the procedure can determine the generation probability of the peak value in those clock skews.

Figure 35:
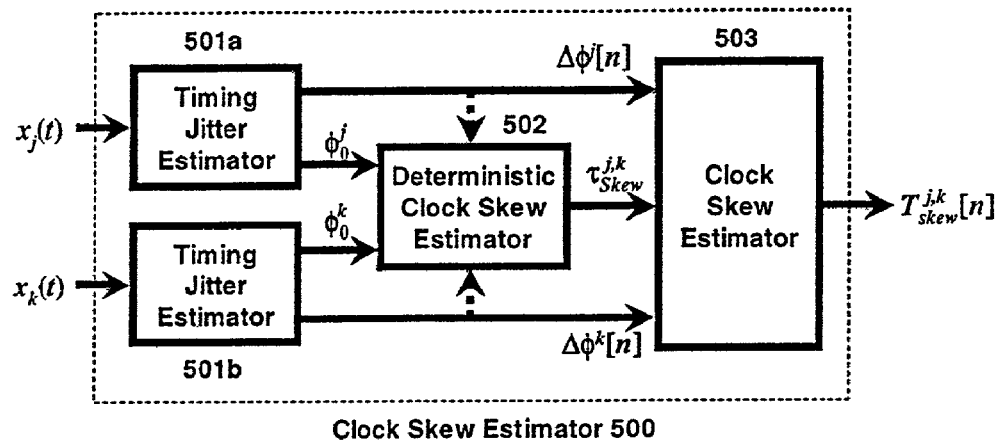
FIG. 35 is a diagram showing an example of structure in the clock skew estimator in the present invention.

FIG. 35 shows an example of structure in the clock skew estimator used in the embodiment of the present invention. The clock skew estimator 500 is comprised of timing jitter estimators 501a and 501b for estimating the timing jitter sequences of the clock signals under test, a deterministic clock skew estimator 502 for estimating the timing errors between the ideal clock edges of the clock signals under test to determine the deterministic components of the clock skews, and a clock skew calculator 503 for receiving the above timing jitter sequences to calculate the timing differences and outputting the clock skew sequences. In addition to the timing jitter sequences, the timing jitter estimators 501a and 501b also estimate the initial phase angles of the signals under test, and output them to the deterministic clock skew estimator 502. The detailed structure of the timing jitter estimator will be explained later.

Figure 36:
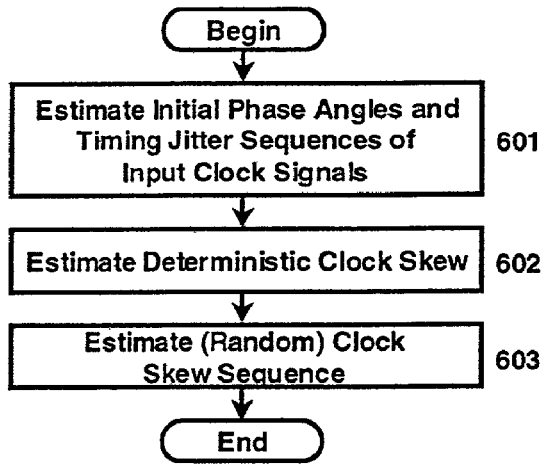
FIG. 36 is a flow chart showing an example of clock skew estimation method in the present invention.

Next, with the use of the clock skew estimator 500 in the present invention, the operation for conducting the clock skew estimation between the clock signals under test will be explained. FIG. 36 shows the procedure for the clock skew estimating method in the present invention. First, in step 601, the timing jitter estimators 501a and 501b estimate the initial phase angles of the signals under test and the timing jitter sequences. Next, in step 602, the deterministic clock skew estimator 502 calculates the difference between the initial phase angles of the signals under test received from the timing jitter estimators 501a and 501b to estimate the deterministic components of the clock skews between the signals under test. Lastly, in step 603, the clock skew calculator 503 estimates the clock skew sequences between the signals under test based on the timing jitter sequences obtained from the timing jitter estimators 501a and 501b and the deterministic components of the clock skews obtained from the deterministic clock skew estimator 502, and the process ends.

In the step 602, in which the deterministic components of the clock skews between the signals under test are estimated, the deterministic clock skew estimator 502 obtains the deterministic components in the clock skews between the signals under test by using the equation (16). Also, in the above step 602, the deterministic clock skew estimator 502 can determine the absolute value of the equation (16) when necessary. Further, in the step 603, where the clock skew sequences between the signals under test are estimated, the clock skew calculator 503 determines the clock skew sequences between the signals under test by using the equation (6). Moreover, the step 601, in which the initial phase angles of the signals under test and timing jitter sequences are estimated, can be replaced with a procedure shown in FIG. 44. In addition, the step 602, in which the deterministic components of the clock skews between the signals under test are estimated, can be replaced with a procedure shown in FIG. 38.

The clock skew estimator shown in FIG. 35 can be structured as an apparatus for estimating only the random components of the clock skews. In this situation, the deterministic clock skew estimator 502 for determining the deterministic components of the clock skews can be omitted. Similarly, the clock skew estimating method shown in FIG. 36 can estimate only the random components of the clock skews. In this arrangement, the step 602 for estimating the deterministic components of the clock skews from the initial phase angles of the signals under test can be omitted.

Figure 37:
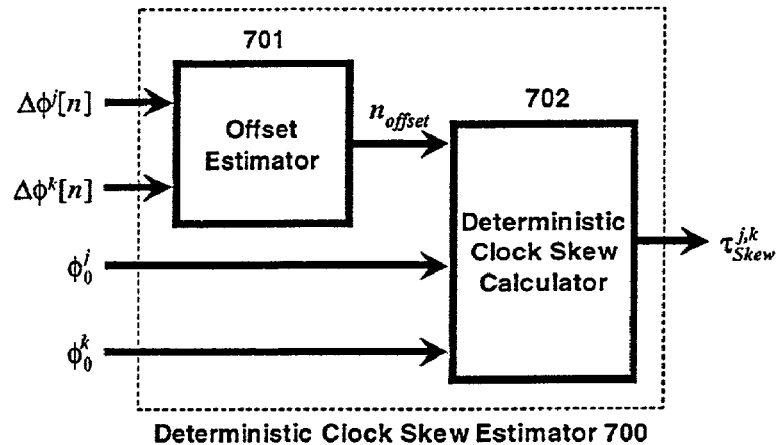
FIG. 37 is a diagram showing an example of structure in the deterministic clock skew estimator in the present invention.

The above deterministic clock skew estimator 502 can be implemented by the configuration shown in FIG. 37. FIG. 37 shows an example of structure in the deterministic clock skew estimator used in the embodiment of the present invention. The deterministic clock skew estimator 700 is comprised of an offset estimator 701 for receiving the initial phase angles and the timing jitter sequences of the signals under test for estimating the offset between the clock edges corresponding to the signals under test based on the timing jitter sequences, and a deterministic clock skew calculator 702 for calculating the deterministic components of the clock skews between the signals under test based on the initial phase angles and the offset of the clock edges estimated by the offset estimator 701.

Figure 38:
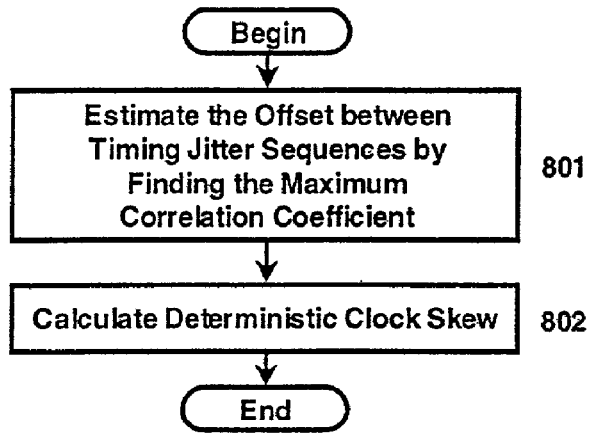
FIG. 38 is a flow chart showing an example of deterministic clock skew estimation method in the present invention.

Next, with use of the deterministic clock skew estimator 700 in the present invention, the operation for estimating the deterministic components of the clock skews between the signals under test will be explained. FIG. 38 shows the procedure for the deterministic clock skew estimating method in the present invention. First, in step 801, the offset estimator 701 determines the offset position where the correlation coefficient between the timing jitter sequences becomes the largest based on the timing jitter sequences of the signals under test, thereby estimating the offset $n_{offset}$ between the corresponding clock edges. Then, in step 802, the deterministic clock skew calculator 702 calculates the deterministic components of the clock skews between the signals under test based on the initial phase angles and the offset in the clock edges estimated by the offset estimator 701, and the process ends. In the step 802, where the deterministic components of the clock skews between the signals under test are calculated, the deterministic clock skew calculator 702 obtains the deterministic components of those clock skews between the signals under test by using the equation (21).

Figure 39:
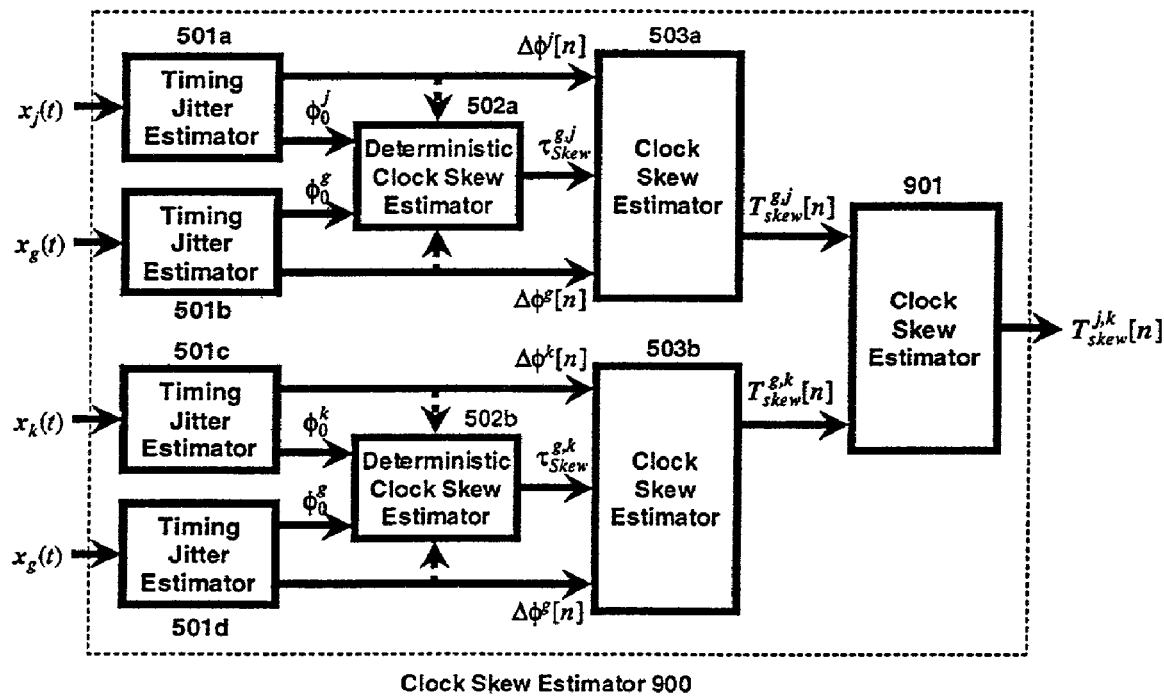
FIG. 39 is a diagram showing another example of structure in the clock skew estimator in the present invention.

FIG. 39 shows another structural example of the clock skew estimator used in the embodiment of the present invention. The clock skew estimator 900 is comprised of timing jitter estimators 501a, 501b, 501c, and 501d for estimating the timing jitter sequences $\Delta\phi^j[n]$, $\Delta\phi^g[n]$, $\Delta\phi^k[n]$, and $\Delta\phi^g[n]$ in the clock signals $x_j(t)$, $x_g(t)$, $x_k(t)$, and $x_g(t)$ under test respectively, deterministic clock skew estimators 502a and 502b for estimating the timing errors between the ideal clock edges of the clock signals $x_j(t)$ and $x_g(t)$ under test as well as between the clock signals $x_k(t)$ and $x_g(t)$ under test to estimate the deterministic components $\tau^{g,j}_{Skew}$ and $\tau^{g,k}_{Skew}$ of the clock skews, clock skew calculators 503a and 503b for receiving the timing jitter sequences and calculating their timing differences therebetween to output the clock skew sequences $T^{g,j}_{Skew}[n]$ and $T^{g,k}_{Skew}[n]$, and another clock skew calculator 901 for receiving the above clock skew sequences from the clock skew calculators 503a and 503b to determine the difference between the clock skew sequences and estimate the clock skew sequence $T^{j,k}_{Skew}[n]$. For simplicity of explanation, description for the duplicated parts is omitted.

Figure 40:
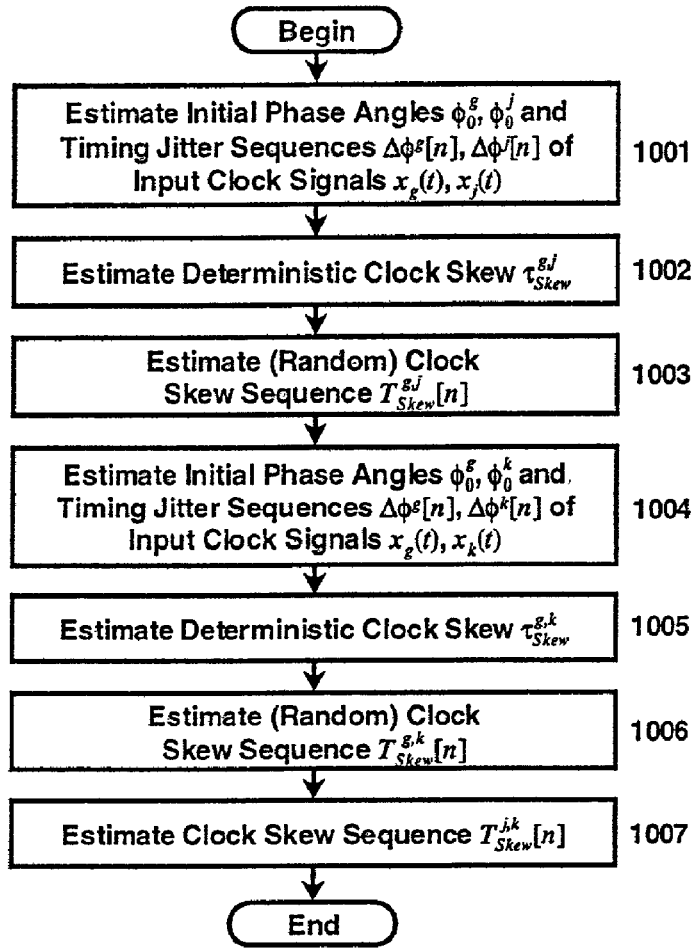
FIG. 40 is a flow chart showing another example of clock skew estimation method in the present invention.

Next, with use of the clock skew estimator 900 in the present invention, the operation for conducting the clock skew estimation among the signals under test will be explained. FIG. 40 shows the procedure of the clock skew estimation method in the present invention. First, in step 1001, timing jitter estimators 501a and 501b estimate the initial phase angles $\phi^j_0$ and $\phi^g_0$ and timing jitter sequences $\Delta\phi^j[n]$ and $\Delta\phi^g[n]$ of the signals $x_j(t)$, $x_g(t)$ under test. Then, in step 1002, the deterministic clock skew estimator 502a calculates the difference between the initial phase angles $\phi^j_0$ and $\phi^g_0$ of the signals under test obtained from the timing jitter estimators 501a and 501b to estimate the deterministic component $\tau^{g,j}_{Skew}$ of the clock skews between the signals under test. Then, in step 1003, the clock skew calculator 503a estimates the clock skew sequence $T^{g,j}_{Skew}[n]$ between the signals under test based on the timing jitter sequences $\Delta\phi^j[n]$ and $\Delta\phi^g[n]$ obtained from the above timing jitter estimators 501a and 501b and based on the deterministic component $\tau^{g,j}_{Skew}$ of the clock skews obtained from the deterministic clock skew estimator 502a.

Next, in step 1004, the timing jitter estimators 501c and 501d estimate the initial phase angles $\phi^k_0$ and $\phi^g_0$ and the timing jitter sequences $\Delta\phi^k[n]$ and $\Delta\phi^g[n]$ of the signals $x_k(t)$, $x_g(t)$ under test. In step 1005, the deterministic clock skew estimator 502b calculates the difference between the initial phase angles $\phi^k_0$ and $\phi^g_0$ of the signals under test obtained from the timing jitter estimators 501c and 501d to estimate the deterministic component $\tau^{g,k}_{Skew}$ of the clock skews between the signals under test. Then, in step 1006, the clock skew calculator 503b estimates the clock skew sequence $T^{g,k}_{Skew}[n]$ between the signals under test based on the timing jitter sequences $\Delta\phi^k[n]$ and $\Delta\phi^g[n]$ obtained from the above timing jitter estimators 501c and 501d and based on the deterministic component $\tau^{g,j}_{Skew}$ of the clock skews obtained from the deterministic clock skew estimator 502b.

Lastly, in step 1007, the clock skew calculator 901 estimates the clock skew sequence $T^{j,k}_{Skew}[n]$ between the signals $x_j(t)$, $x_k(t)$ under test based on the clock skew sequences $T^{g,j}_{Skew}[n]$ and $T^{g,k}_{Skew}[n]$ obtained from the clock skew calculators 503a and 503b, and the process ends. In the above step 1007, in which the clock skew sequences between the signals $x_j(t)$, $x_k(t)$ under test are estimated, the clock skew calculator 901 determines the clock skew sequences between the signals under test by using the equation (28). To simplify the explanation, descriptions for the duplicated parts are omitted.

The clock skew estimator shown in FIG. 39 can be structured as an apparatus for estimating only the random components of the clock skew. Under such a construction, the deterministic clock skew estimators 502a and 502b for determining the deterministic components of the clock skews can be eliminated. Similarly, the clock skew estimating method shown in FIG. 40 can estimate only the random components of the clock skew. Under such a procedure, the steps 1002 and 1005 for estimating the deterministic components of the clock skews from the initial phase angles of the signals under test can be eliminated.

Figure 41:
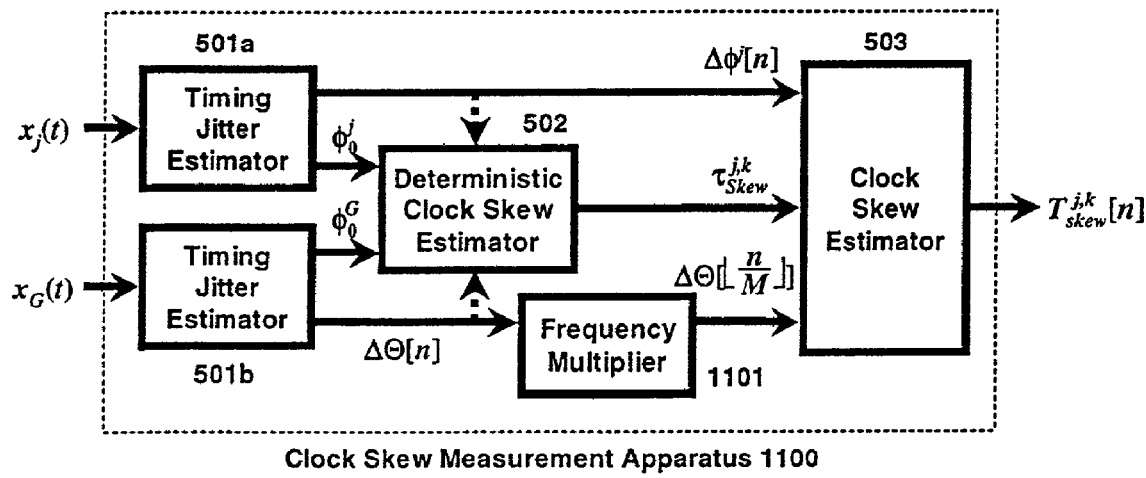
FIG. 41 is a diagram showing a further example of structure in the clock skew estimator in the present invention.

FIG. 41 shows another structural example of the clock skew estimator used in the embodiment of the present invention. This clock skew estimator 1100 is similar to the clock skew estimator shown in FIG. 35 except for the inclusion of a frequency multiplier 1101 for receiving the timing jitter sequences estimated by the timing jitter estimator 501*b* to copy the timing jitter sequences by, for example, M−1 times, and to determine the timing jitter sequences when the signals under test are multiplied by M times (in order to simplify the explanation, descriptions for the duplicated parts are omitted).

Figure 42:
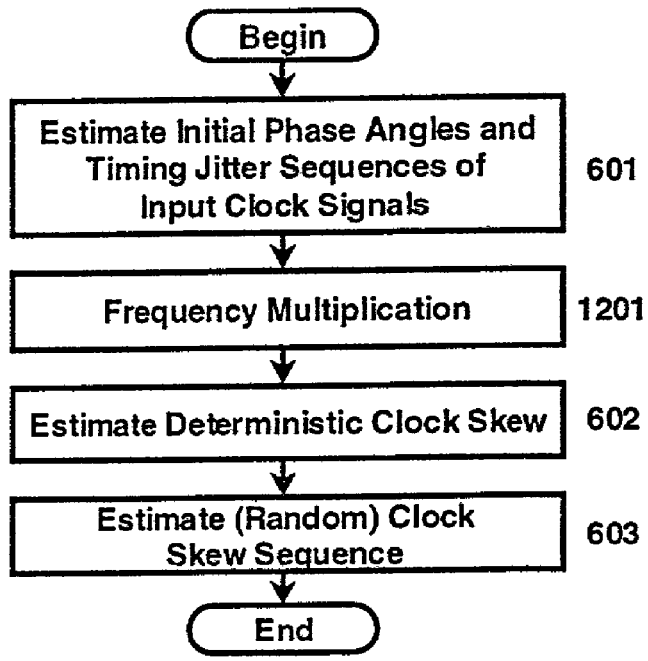
FIG. 42 is a flow chart showing a further example of clock skew estimation method in the present invention.

Next, with the use of the clock skew estimator 1100 in the present invention, the operation for conducting the clock skew estimation in the signals under test will be explained. FIG. 42 shows another procedure of the clock skew estimation method in the present invention. This clock skew estimation method is similar to the clock skew estimation method shown in FIG. 36 except for having a step 1201 in which, after determining the timing jitter sequences, the frequency multiplier 1101 copies the timing jitter sequences estimated by the timing jitter estimator 510*b* by, for example, M−1 times, to determine the timing jitter sequences when the signals under test are multiplied by M times (in order to simplify the explanation, descriptions for duplicated parts are omitted). Under this situation, in the above step 602 for estimating the deterministic components of the clock skews between the signals under test, the deterministic clock skew estimator 502 obtains the deterministic components of the clock skews between the signals under tested by using the equation (25). Also, in the above noted step 603 in which the clock skew sequences between the signals under test are estimated, the clock skew calculator 503 determines the clock skew sequences between the signals under test by using the equation (24).

The clock skew estimator shown in FIG. 41 can be structured as an apparatus for estimating only the random components of the clock skews. In such a situation, the deterministic clock skew estimator 502, which determines the deterministic components of the clock skews, can be eliminated. Similarly, the clock skew estimating method shown in FIG. 42 can also estimate only the random components of the clock skews. At this time, the step 602 in which the deterministic components of the clock skews can be estimated from the initial phase angles of the signals under test, can be omitted.

Further, the above frequency multiplier can be incorporated into the clock skew estimator shown FIG. 39. In such a construction, the frequency multiplier is inserted directly at the output of the timing jitter estimators 501*b* and 501*d*. Similarly, the step for multiplying the frequency can be added to the clock skew estimating method shown in FIG. 40. At this time, the step to multiply the frequency is inserted after the steps 1001 and 1004 in which the timing jitters are estimated.

Figure 43:
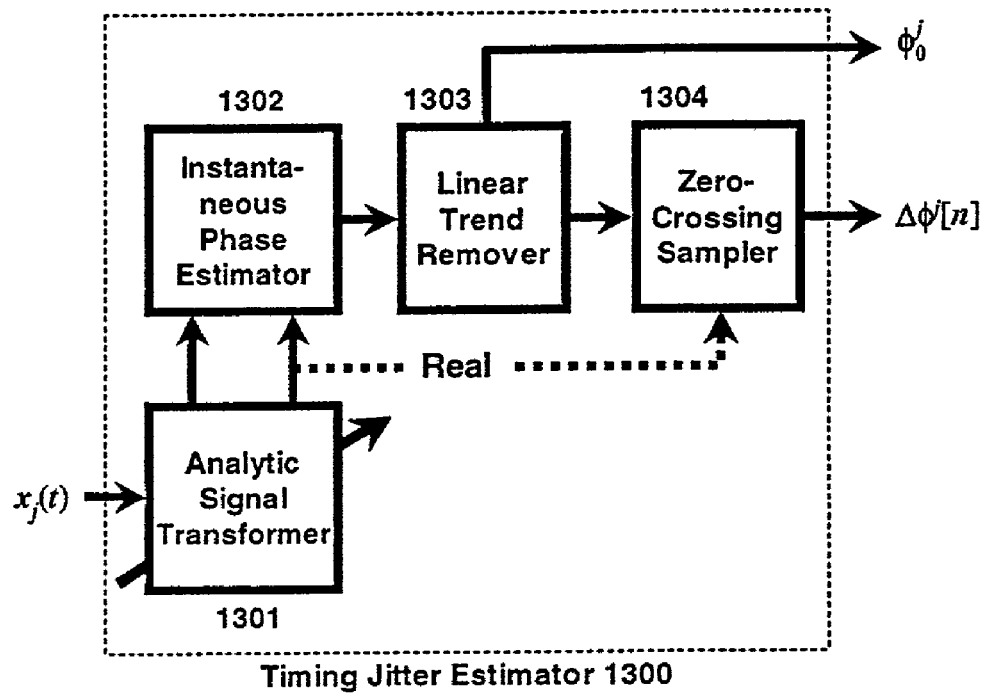
FIG. 43 is a diagram showing an example of structure in the timing jitter estimator used in the clock skew estimator in the present invention.

FIG. 43 shows a structural example of the timing jitter estimator used in the clock skew estimator of the present invention. The timing jitter estimator 1300 is comprised of an analytic signal transformer 1301 for transforming the signal under test into a band-limited analytic signal of complex number, an instantaneous phase estimator 1302 for determining the instantaneous phase of the analytic signal transformed by the analytic signal transformer 1301, a linear trend remover 1303 for removing the linear phase from the instantaneous phase estimated by the instantaneous phase estimator 1302 to obtain the instantaneous phase noise, and a zero-crossing resampler 1304 for receiving the instantaneous phase noise estimated by the linear trend remover 1303 to resample only the instantaneous phase noise data closest to the zero-crossing timings of the real part of the analytic signal and to output the timing jitter sequences. The analytic signal transformer 1301 can use the structure shown in FIGS. 45, 47, or 49. Also, the analytic signal transformer 1301 can be structured to freely change the pass band of the signals. Further, the linear trend remover 1303 determines the initial phase angles of the signals under test as well as the instantaneous phase noise, and outputs them to the deterministic clock skew estimator.

Figure 44:
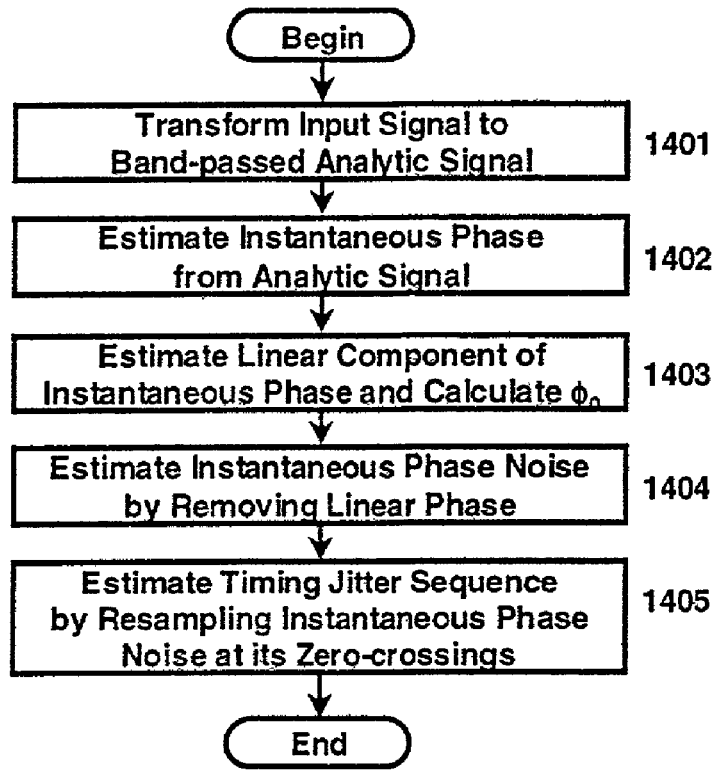
FIG. 44 is a flow chart showing an example of timing jitter estimating method used in the clock skew estimating method in the present invention.

Next, with use of the timing jitter estimator 1300 in the present invention, the operation in the method for estimating the initial phase angles as well as the timing jitter sequences in the signals under test will be explained. FIG. 44 shows the procedure of the timing jitter estimation method in the present invention. First, in step 1401, the analytic signal transformer 1301 transforms the signals under test into an analytic signal, where the predetermined frequency components are selectively passed there through. Next, in step 1402, the instantaneous phase estimator 1302 estimates the instantaneous phase of the signal under test by using the analytic signal obtained from the analytic signal transformer 1301. Then, in step 1403, the linear trend remover 1303 estimates the linear phase corresponding to an ideal clock signal based on the instantaneous phase estimated by the instantaneous phase estimator 1302, and determines the initial phase angle of the signal under test.

Then, in step 1404, the linear trend remover 1303 removes the linear phase from the instantaneous phase to estimate the instantaneous phase noise. Lastly, in step 1405, the zero-crossing resampler 1304 resamples only the instantaneous phase noise closest to the zero-crossing timing of the real part of the analytic signal based on the instantaneous phase noise estimated by the linear trend remover 1303 to estimate the timing jitter sequences, and the process ends. The above noted step 1401 for transforming the signal under test into the analytic signal can be conducted by the procedure shown in FIGS. 46, 48, or 50.

Figure 45:
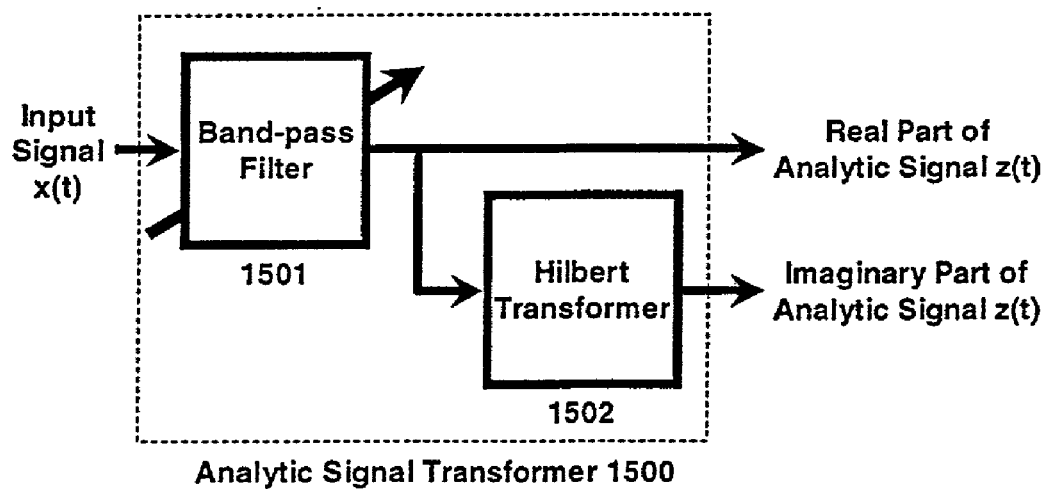
FIG. 45 is a diagram showing an example of structure in the analytic signal transformer used in the clock skew estimator in the present invention.

FIG. 45 shows a structural example of the analytic signal transformer used in the timing jitter estimator 1300 of the present invention. The analytic signal transformer 1500 is comprised of a band-pass filter 1501 for extracting only the components closest to the fundamental frequency of the signal under test to band-limit the signal under test, and a Hilbert transformer 1502 for Hilbert-transforming the output signal from the band-pass filter 1501 to generate a Hilbert transformed pair. The band-pass filter 1501 can be an analog filter or a digital filter, or can be implemented through digital signal processing such as FFT. Further, the band-pass filter 1501 can be structured to freely change the pass band of the signal.

Figure 46:
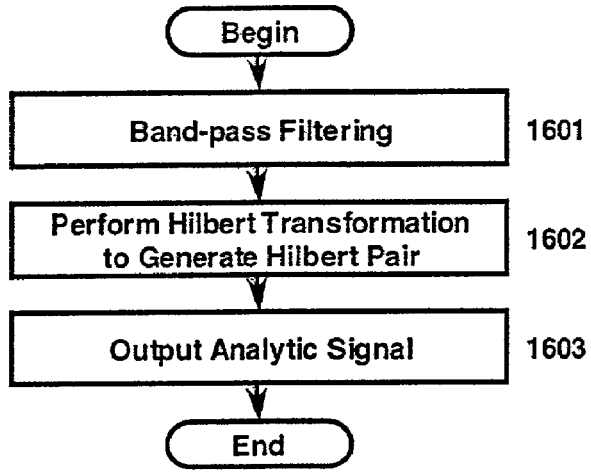
FIG. 46 is a flow chart showing an example of analytic signal transformation method used in the clock skew estimating method in the present invention.

Next, with the use of the analytic signal transformer 1500 in the present invention, the operation for transforming the signal under test into band-limited analytic signal will be explained. FIG. 46 shows the procedure for the signal transformation method of the present invention. First, in step 1601, the band-pass filter 1501 removes only the components closest to the fundamental frequency from the signal under test to band-limit those signal under test. Then, in step 1602, the Hilbert transformer 1502 applies the Hilbert transformation to the band-limited signal under test, and generates a Hilbert transformed pair of the input signal corresponding to the imaginary part of the analytic signal. Lastly, in step 1603, the analytic signal transformer 1500 generates the output signal from the band-pass filter 1501 as a real part of the analytic signal and the output signal from the Hilbert transformer 1502 as an imaginary part of the analytic signal, then the process ends.

Figure 47:
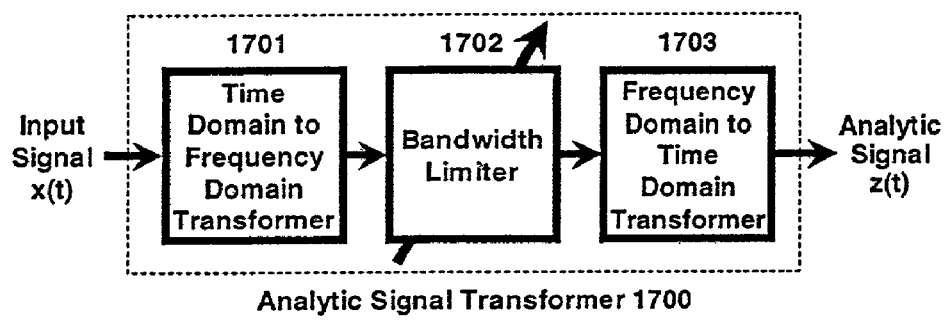
FIG. 47 is a diagram showing another example of structure in the analytic signal transformer used in the clock skew estimator in the present invention.

FIG. 47 shows another structural example of the analytic signal transformer used in the timing jitter estimator 1300 of the present invention. The analytic signal transformer 1700 is comprised of a time domain to frequency domain transformer 1701 for transforming the signal under test into both-side spectra signal in a frequency domain, a bandwidth limiter 1702 for extracting only the components closest to the positive fundamental frequency from the both-side spectra signal in the frequency domain, and a frequency domain to time domain transformer 1703 for transforming the output of the bandwidth limiter 1702 back into the time domain signal. The time domain to frequency domain transformer 1701 and the frequency domain to time domain transformer 1703 can be implemented by FFT and inverse FFT, respectively. Also, the bandwidth limiter 1702 can be structured to freely change the pass band of the signal.

Figure 48:
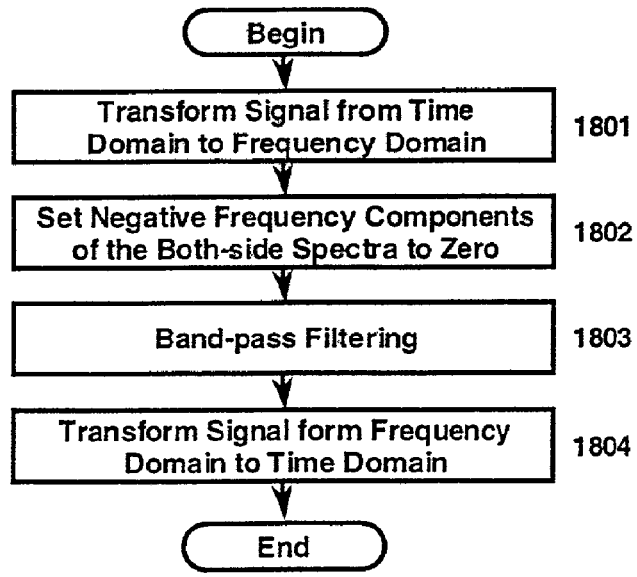
FIG. 48 is a flow chart showing another example of analytic signal transformation method used in the clock skew estimating method in the present invention.

Next, with use of the analytic signal transformer 1700 in the present invention, the operation for transforming the signals under test into band-limited analytic signals will be explained. FIG. 48 shows another procedure of the signal transformation method in the present invention. First, in step 1801, the time domain to frequency domain transformer 1701 applies the FFT to the signal under test to transform the time domain signal into the both-side spectra signal in the frequency domain. Then, in step 1802, the bandwidth limiter 1702 replaces the negative frequency components with zero for the transformed both-side spectra signal in the frequency domain. Then, in step 1803, the bandwidth limiter 1702 retains only the components closest to the fundamental frequency of the signal under test in the one-side spectra signal, where the negative frequency components are replaced with zero, to band-limit the signal in the frequency domain. Lastly, in step 1804, the frequency domain to time domain transformer 1703 applies the inverse FFT to the band-limited one-side spectra signal to transform the frequency domain signal into analytic signal in the time domain, and then the process ends. The order of the above steps 1802 and 1803 can be switched to one another, i.e., after the step of retaining only the components closest to the fundamental frequency of the signal under test to replace the remaining frequency components by zero and band-limit signal in the frequency domain, the step for replacing the negative frequency components in the both-side spectra signal with zero can be performed.

Figure 49:
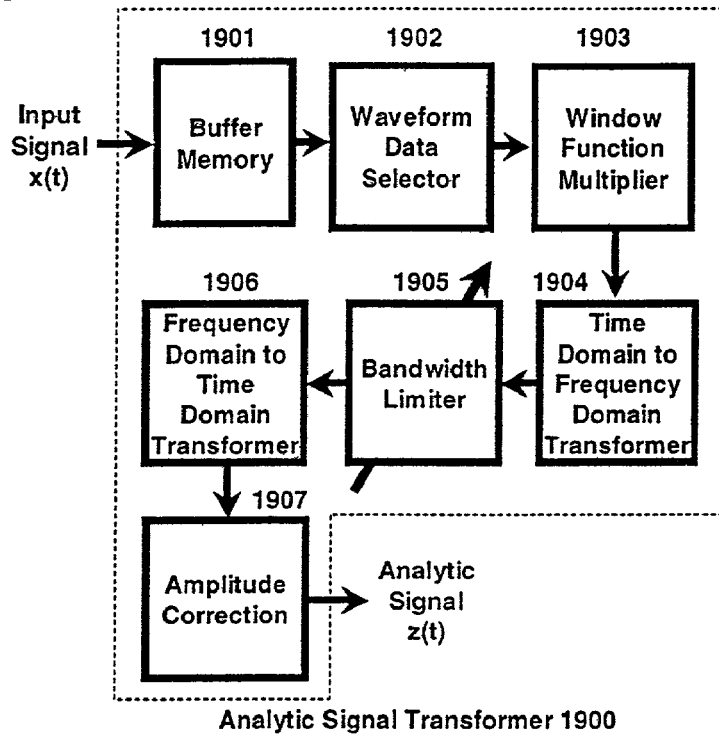
FIG. 49 is a diagram showing a further example of structure in the analytic signal transformer used in the clock skew estimator in the present invention.

FIG. 49 shows a further example of structure in the analytic signal transformer used in the timing jitter estimator 1300 of the present invention. The analytic signal transformer 1900 is comprised of a buffer memory 1901 for storing the signal under test, a signal selector (waveform data selector) 1902 for sequentially extracting the signal from the buffer memory 1901 while overlapping the part of the extracted signal with the one previously extracted, a window function multiplier 1903 for multiplying a window function by each extracted part of the signal, a time domain to frequency domain transformer 1904 for transforming each part of the signal multiplied by the window function into both-side spectra signal in the frequency domain, a bandwidth limiter 1905 for extracting only the components closest to the positive fundamental frequency of the signal under test from the both-side spectra signal transformed into the frequency domain, a frequency domain to time domain transformer 1906 for transforming the output of the bandwidth limiter 1905 back into the time domain signal, and an inverse window function multiplier 1907 for multiplying the inverse window function by the signal transformed into the time domain to obtain the band-limited analytic signal. The time domain to frequency domain transformer 1904 and the frequency domain to time domain transformer 1906 can be implemented by using the FFT and the inverse FFT, respectively. Further, the bandwidth limiter 1905 can be structured to freely change the pass band of the signal.

Figure 50:
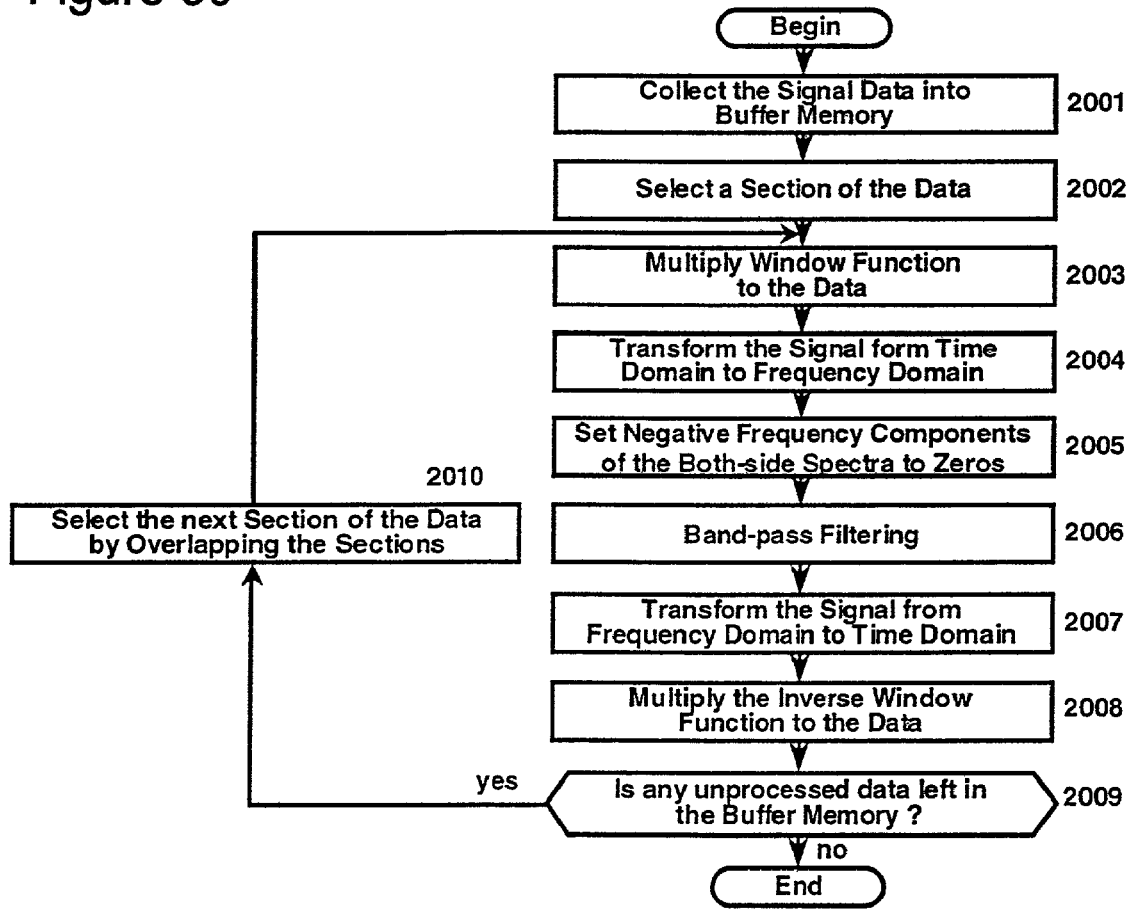
FIG. 50 is a flow chart showing a further example of analytic signal transformation method used in the clock skew estimating method in the present invention.

Next, with use of the analytic signal transformer 1900 in the present invention, the operation for transforming the signal under test into the band-limited analytic signal will be explained. FIG. 50 shows a further procedure of the signal transformation method of the present invention. First, in step 2001, the signal under test is stored in the buffer memory 1901. Then, in step 2002, the signal selector 1902 extracts a part of the signal stored in the buffer memory 1901. Then, in step 2003, the window function multiplier 1903 multiplies the window function to the extracted part of the signal. Next, in step 2004, the time domain to frequency domain transformer 1904 applies the FFT process to the signal multiplied by the window function to transform the time domain signal into the both-side spectra signal in the frequency domain. Then, in step 2005, the bandwidth limiter 1905 replaces the negative frequency components with zero for the both-side spectra signal in the frequency domain.

Next, in step 2006, the bandwidth limiter 1905 retains only the components closest to the fundamental frequency of the signal under test in the one-side spectra signal, where the negative frequency components are replaced with zero, to replace the remaining frequency components with zero, thereby band-limiting the frequency domain signal. Then, in step 2007, the frequency domain to time domain transformer 1906 applies the inverse FFT to the band-limited one-side spectra signal in the frequency domain to transform the frequency domain signal into the time domain signal. Then, in step 2008, the inverse window function multiplier 1907 multiplies the inverse window function produced in the step 2003 by the inverse transformed time domain signal to determine the band-limited analytic signals.

Lastly, in step 2009, inspections are performed to see if there is any unprocessed data existing in the buffer memory. If it does exist, in step 2010, the signal selector 1902 extracts the signal from the buffer memory while overlapping the part of the signal with the previously extracted signal, and the steps 2003-2009 are repeated thereafter. If it does not exist, the process will end. The order of the above steps 2005 and 2006 can be switched to one another, i.e., after the step of retaining only the components closest to the fundamental frequency of the signal under test by replacing the remaining frequency components with zero and band-limit those frequency domain signal, the step for replacing the negative frequency components with the both-side spectra signal with zero can be performed.

Figure 51:
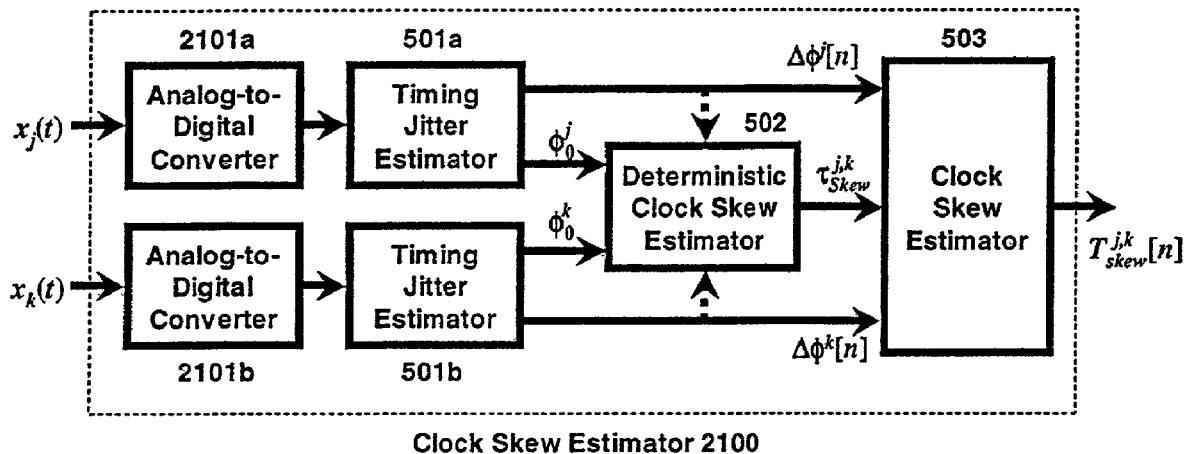
FIG. 51 is a diagram showing a further example of structure in the clock skew estimator in the present invention.

FIG. 51 shows a further structural example of the clock skew estimator used in the embodiment of the present invention. This clock skew estimator 2100 is similar to the clock skew estimator shown in FIG. 35 except for the inclusion of AD converters 2101a and 2101b for digitizing the analog signals under test to be converted into digital signals. In order to simplify the explanation, descriptions for duplicated parts are omitted. For the AD converter, a high speed AD transformer, digitizer, or digital sampling oscilloscope can be preferably used.

Figure 52:
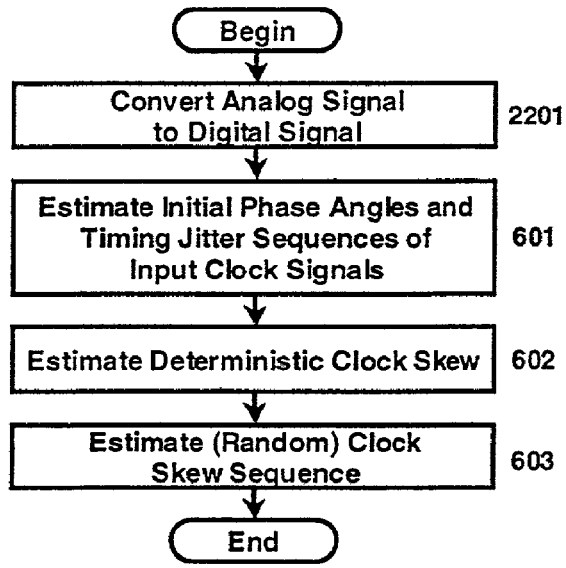
FIG. 52 is a flow chart showing a further example of clock skew estimation method in the present invention.

Next, with use of the clock skew estimator 2100 in the present invention, the operation of the clock skew measurement for the signals under test will be explained. FIG. 52 shows such a procedure of the clock skew estimation method in the present invention. This clock skew estimating method is similar to the clock skew estimating method shown in FIG. 36 except for the inclusion of a step 2201 in which, prior to the start of the procedure, the AD converters 2101*a* and 2101*b* sample (digitize) the analog signals under test, which are subject to the clock skew measurement, and convert them into the digital signals. In order to simplify the explanation, descriptions for the duplicated parts are omitted.

The above noted AD converters can be incorporated in the clock skew estimator 1100 having the frequency multiplier shown in FIG. 41. In such a situation, the procedure of the clock skew estimation method shown in FIG. 42 additionally includes a step where, prior to the start of the procedure, the AD converters sample (digitize) the analog signals under test, which are subject to the clock skew measurement, and convert them into the digital signals.

Further, the above AD transformers can be incorporated in the clock skew estimator 900 shown in FIG. 39. Similarly, the step for sampling (digitizing) the signals under test to transform them into the digital signals can be incorporated into the clock skew estimating method shown in FIG. 40.

Figure 53:
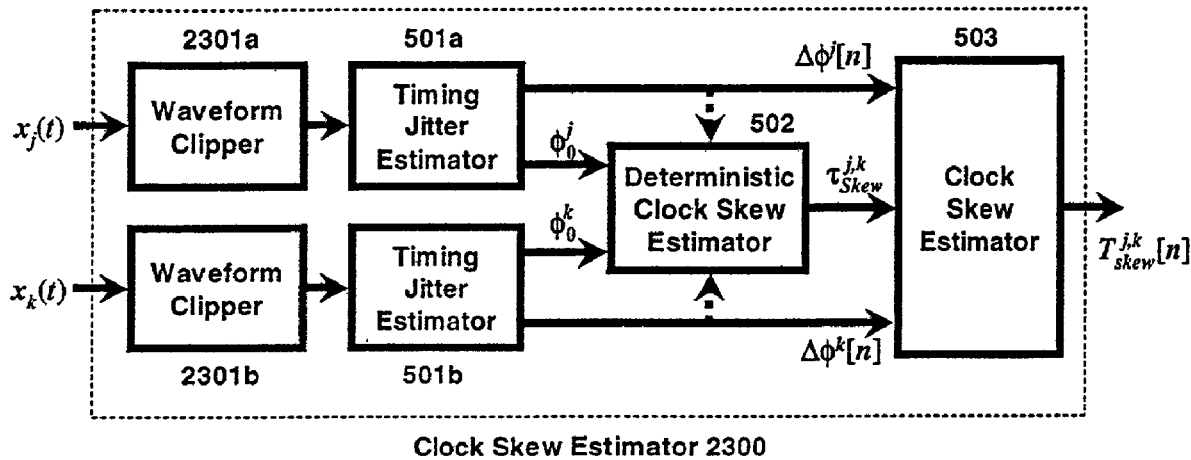
FIG. 53 is a diagram showing a further example of structure in the clock skew estimator in the present invention.

FIG. 53 shows a further structural example of the clock skew estimator used in the embodiment of the present invention. This clock skew estimator 2300 is similar to the clock skew estimator shown in FIG. 35 except for the inclusion of waveform clippers (waveform clipping means) 2301*a* and 2301*b* for removing the AM components in the signals under test. For simplicity of explanation, descriptions for the duplicated parts are omitted.

Figure 54:
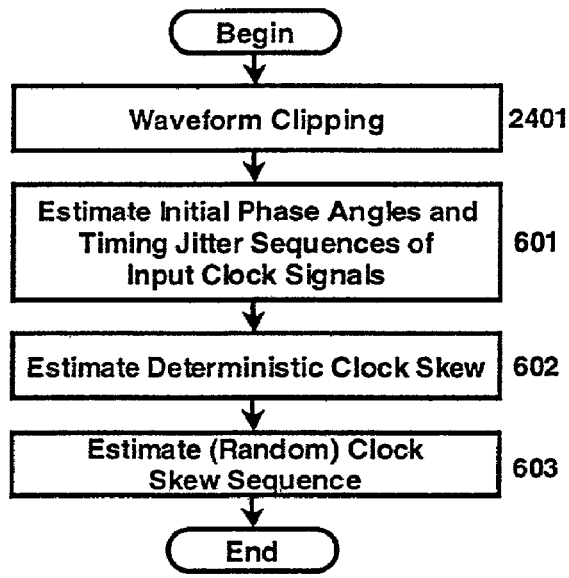
FIG. 54 is a flow chart showing a further example of clock skew estimation method in the present invention.

Next, with use of the clock skew estimator 2300 in the present invention, the operation for the clock skew measurement of the signals under test will be explained. FIG. 54 shows another procedure of the clock skew estimating method of the present invention. This clock skew estimating method is similar to the jitter measurement method shown in FIG. 36 except for the inclusion of a step 2401, where the waveform clippers 2301*a* and 2301*b* remove the AM components from the signals under test prior to the start of the procedure. In order to shorten the explanation, descriptions for the duplicated parts are omitted.

The above waveform clippers can be incorporated in the clock skew estimator 1100 having the frequency multiplier shown in FIG. 41. In such an arrangement, the procedure for the clock skew estimation method shown in FIG. 42 is provided with a step where the waveform clippers remove the AM components from the signals under test prior to the start of the procedure.

Also, the above waveform clippers can be incorporated into the clock skew estimator 900 shown in FIG. 39. Similarly, the step where the waveform clipper removes the AM components of the signals under test can be incorporated in the clock skew estimating method shown in FIG. 40.

Figure 55:
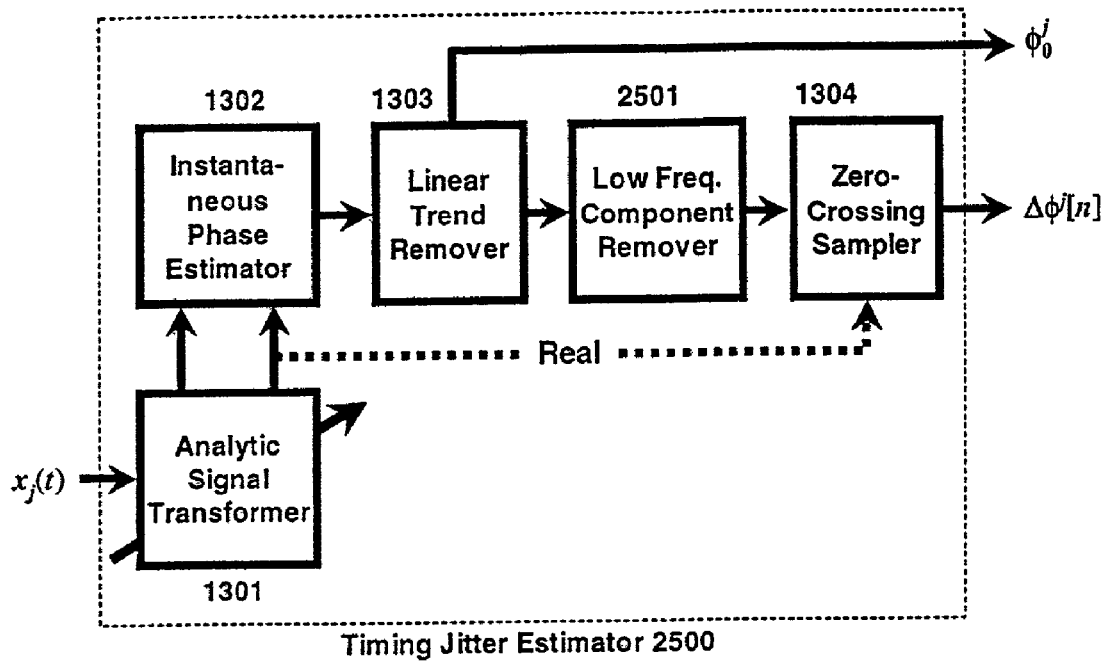
FIG. 55 is a diagram showing a further example of structure in the timing jitter estimator used in the clock skew estimator in the present invention.

FIG. 55 shows a further structural example of the timing jitter estimator used in the embodiment of the present invention. This timing jitter estimator 2500 is similar to the timing jitter estimator shown in FIG. 43 except for the inclusion of a low frequency component remover 2501 which receives the instantaneous phase noise and removes the low frequency components from the instantaneous phase noise and provides the instantaneous phase noise to the zero-crossing resampler. In order to simplify the explanation, descriptions for the duplicated parts are omitted.

Figure 56:
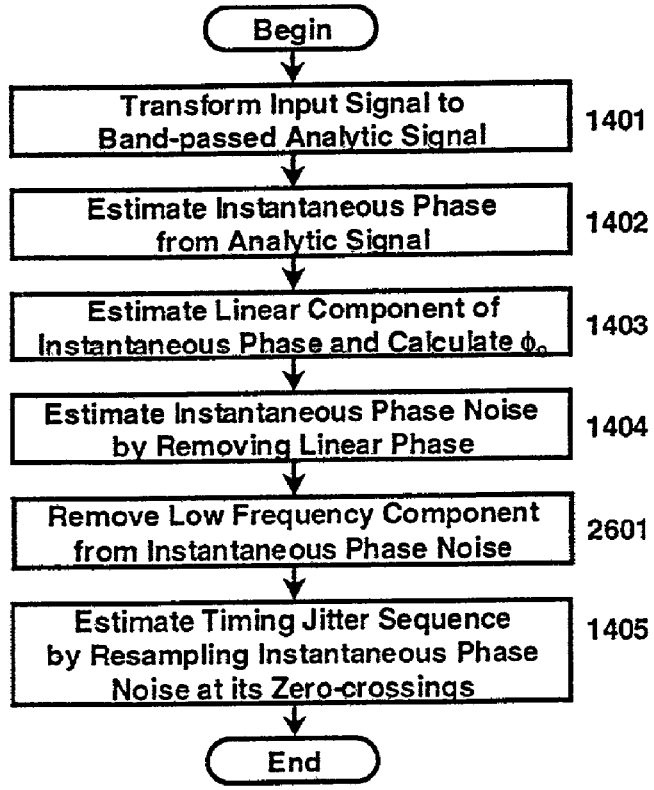
FIG. 56 is a flow chart showing a further example of timing jitter estimating method used in the clock skew estimating method in the present invention.

Next, with use of the timing jitter estimator 2500 in the present invention, the operation for estimating the initial phase angles of the signals under test and timing jitter sequences will be explained. FIG. 56 shows such a procedure for the timing jitter estimation method of the present invention. This timing jitter estimating method is similar to the timing jitter estimating method shown in FIG. 44 except for the inclusion of a step 2601 in which, after estimating the instantaneous phase noise, the low frequency component remover 2501 removes the low frequency components from the instantaneous phase noise. For simplicity of explanation, descriptions for the duplicated parts are omitted.

According to the probability estimation apparatus for peak-to-peak clock skews as well as the probability estimation method for peak-to-peak clock skews of the present invention, by assuming the linear clock skews to be Gaussian-based random processes and determining the Rayleigh probability density distribution function of the peak-to-peak value in the clock skews, the estimation of the probability of the peak-to-peak value in the clock skews exceeding the predetermined value, for which no traditionally effective methods existed, can be achieved, resulting in the dramatic improvement in the effectiveness of the product reliability analysis.

Furthermore, according to the probability estimation apparatus for peak-to-peak clock skews as well as the probability estimation method for peak-to-peak clock skews of the present invention, by measuring the peak-to-peak value in the clock skews and calculating the generation probability thereof, the generation probability of the peak-to-peak value can be examined as to whether it satisfies the product specifications or not, thereby dramatically improving the effectiveness of the reliability analysis of products which was not possible in the conventional technology.

What is claimed is:

1. A probability estimating apparatus for peak-to-peak values in clock skews among a plurality of clock signals under test, comprising:
   a clock skew estimator for estimating clock skew sequences among the plurality of clock signals under test; and
   a probability estimator for determining a generation probability of the peak-to-peak values in the clock skews among the plurality of clock signals under test based on the clock skew sequences from the clock skew estimator by applying Rayleigh distribution;
   wherein said clock signals under test have pulse waveforms, and wherein said probability estimator estimates the generation probability of the peak-to-peak value based on RMS (root mean square) values of the clock signals under test obtained by the clock skew estimator by applying ratios between the peak-to-peak value and the RMS values determined by the Rayleigh distribution.

2. A probability estimating apparatus for peak-to-peak clock skews as defined in claim 1, wherein said probability estimator determines the generation probability of a peak value of the clock skews among the plurality of clock signals under test based on said clock skew sequences.

3. An probability estimating apparatus for peak-to-peak clock skews as defined in claim 1, wherein said probability estimator is comprised of:
   an RMS (root mean square) detector for determining an RMS value of data of the clock skew sequences supplied thereto;
   a memory for storing a predetermined value; and
   a probability calculator for determining the probability of the peak-to-peak clock skews among the clock signals under test which exceeding the predetermined value based on said predetermined value and said RMS value.

4. A probability estimating apparatus for peak-to-peak clock skews as defined in claim 1, wherein said probability estimator is comprised of:

an RMS detector for determining an RMS value of data of the clock skew sequences supplied thereto;

a peak-to-peak detector for calculating maximum and minimum values of said clock skew sequence data to determine the peak-to-peak value; and a probability calculator for determining the probability of the clock skews among the clock signals under test exceeding the peak-to-peak value determined by the peak-to-peak detector based on said peak-to-peak value and said RMS value of the clock skew sequence data.

5. A probability estimating apparatus for peak-to-peak clock skews as defined in claim 1, wherein said clock skew estimator is comprised of:

a timing jitter estimator for estimating timing jitter sequences of the plurality of clock signals under test; and a clock skew calculator for receiving a plurality of said timing jitter sequences and calculating timing difference sequences among said timing jitter sequences.

6. A probability estimating apparatus for peak-to-peak clock skews as defined in claim 5, wherein said clock skew estimator includes a second clock skew calculator for receiving said clock skew sequences to determine the difference among the plurality of said clock skew sequences.

7. A probability estimating apparatus for peak-to-peak clock skews as defined in claim 5, wherein said clock skew estimator includes a frequency multiplier for receiving said timing jitter sequences and producing timing jitter sequences which are multiple of a frequency of said clock signals under test.

8. A probability estimating apparatus for peak-to-peak clock skews as defined in claim 5, wherein said clock skew estimator includes a deterministic clock skew estimator for estimating timing errors among ideal clock edges of said plurality of clock signals under test to produce deterministic components of said clock skews.

9. A probability estimating apparatus for peak-to-peak clock skews as defined in claim 5, wherein said timing jitter estimator is comprised of:

an analytic signal transformer for transforming the clock signals under test into analytic signals of complex number;

an instantaneous phase estimator for determining instantaneous phases of said analytic signals;

a linear trend remover for removing linear phases from said instantaneous phases to obtain instantaneous phase noise; and a zero-crossing resampler for receiving said instantaneous phase noise and resampling said instantaneous phase noise for only closest to zero-crossing timings of real part of said analytic signals to produce said timing jitter sequences.

10. A probability estimating apparatus for peak-to-peak clock skews as defined in claim 9, wherein said analytic signal transformer is comprised of:

a band-pass filter for receiving the clock signals under test and extracting only components closest to a fundamental frequency from the signals under test to band-limit said clock signals under test; and a Hilbert transformer for Hilbert-transforming output signals of said band-pass filter to generate a Hilbert conversion pair of said clock signals under test.

11. A probability estimating apparatus for peak-to-peak clock skews as defined in claim 9, wherein said analytic signal transformer is comprised of:

a time domain to frequency domain transformer for transforming the signals under test to both-side spectra signals in the frequency domain;

a bandwidth limiter for extracting only spectral signal components closest to a positive fundamental frequency from said both-side spectra signals; and a frequency domain to time domain transformer for transforming output signals of said bandwidth limiter back to time domain signals.

12. A probability estimating apparatus for peak-to-peak clock skews as defined in claim 9, wherein said analytic signal transformer is comprised of:

a buffer memory for storing the clock signals under test;

means for sequentially extracting the clock signals under test from said buffer memory while overlapping the extracted clock signals with a part of the previously extracted clock signals;

means for multiplying a window function by each of said extracted clock signals;

means for transforming the multiplied extracted clock signals to both-side spectra signals in a frequency domain;

a bandwidth limiter for extracting only the components closest to a positive fundamental frequency of the clock signals under test from said both-side spectra signals transformed into the frequency domain;

means for transforming output signals of said bandwidth limiter back to time domain signals; and means for multiplying an inverse window function by the signals transformed into the time domain to obtain band-limited analytic signals.

13. A probability estimating apparatus for peak-to-peak clock skews as defined in claim 5, wherein said clock skew estimator includes an AD (analog-to-digital) converter for converting said clock signals under test to digital signals.

14. A probability estimating apparatus for peak-to-peak clock skews as defined in claim 5, wherein said clock skew estimator includes a waveform clipper for removing amplitude modulation components of the clock signals under test and retaining only phase modulation components of the clock signals under test.

15. A probability estimating apparatus for peak-to-peak clock skews as defined in claim 9, wherein said analytic signal transformer has an adjustable pass band for the clock signals under test.

16. A probability estimating apparatus for peak-to-peak clock skews as defined in claim 9, wherein said timing jitter estimator includes a low frequency component remover for removing low frequency components from said instantaneous phase noise and providing resultant instantaneous phase noise to said zero-crossing resampler.

17. A probability estimating method for peak-to-peak values in clock skews among a plurality of clock signals under test, comprising the steps of:

estimating the clock skew sequences among the plurality of clock signals under test; and determining a generation probability of a peak-to-peak value of the clock skews among the plurality of clock signals under test based on said clock skew sequences by applying Rayleigh distribution;

wherein said clock signals under test have pulse waveforms, and wherein said generation probability of the peak-to-peak value is estimated based on RMS (root mean square) values of the clock signals under test obtained by said step of estimating the clock skew by applying ratios between the peak-to-peak value and the RMS values determined by the Rayleigh distribution.

18. A probability estimating method for peak-to-peak clock skews as defined in claim 17, said step of determining the generation probability includes a step of determining a generation probability of peak value of the clock skews among the plurality of clock signals under test based on said clock skew sequences.

19. A probability estimating method for peak-to-peak clock skews as defined in claim 17, wherein said step of determining the generation probability of the said clock skew peak value includes the following steps of:
determining an RMS value of data of said clock skew sequences;
storing a predetermined value in a memory; and
determining the probability of the peak-to-peak clock skews among the plurality of clock signals under test exceeding the predetermined value based on said predetermined value and said RMS value.

20. A probability estimating method for peak-to-peak clock skews as defined in claim 17, wherein said step of determining the generation probability of said clock skew peak value includes the following steps of:
determining the RMS value of data of said clock skew sequences;
calculating the difference between the maximum and minimum values of said clock skew sequence data to determine the peak-to-peak value;
determining the probability of the clock skews among the clock signals under test exceeding the peak-to-peak value based on said peak-to-peak value and said RMS value of said clock skew sequence data.

21. A probability estimating method for peak-to-peak clock skews as defined in claim 17, wherein said step of estimating said clock skew sequences include the following steps of:
estimating timing jitter sequences of the plurality of clock signals under test; and
receiving a plurality of said timing jitter sequences and calculating timing differences among said timing jitter sequences to estimate the clock skew sequences.

22. A probability estimating method for peak-to-peak clock skews as defined in claim 21, wherein said step of estimating said clock skew sequences includes a step of receiving said clock skew sequences and determining the difference among the plurality of the clock skew sequences, thereby estimating the probability of peak-to-peak clock skews.

23. A probability estimating method for peak-to-peak clock skews as defined in claim 21, wherein said step of estimating said clock skew sequences includes a step of receiving said timing jitter sequences to estimate timing jitter sequences of signals which are frequency multiplied by said clock signals under test.

24. A probability estimating method for peak-to-peak clock skews as defined in claim 21, wherein said step of estimating the clock skew sequences includes a step of estimating timing errors among ideal clock edges of said plurality of clock signals under test to estimate deterministic components of said clock skews.

25. A probability estimating method for peak-to-peak clock skews as defined in claim 24, wherein said step of estimating the deterministic components of the clock skews among said clock signals under test includes a step of finding the deterministic components of the clock skews by receiving linear instantaneous phase of said plurality of clock signals under test and determining differences among initial phase angles of said linear instantaneous phase.

26. A probability estimating method for peak-to-peak clock skews as defined in claim 25, wherein said step of estimating the deterministic components of the clock skews among said clock signals under test includes a step of receiving timing jitter sequences of the clock signals under test and estimating clock edges corresponding to the clock signals under test and determining an offset value of said clock edges based on correlation among said timing jitter sequences.

27. A probability estimating method for peak-to-peak clock skews as defined in claim 24, wherein said step of estimating the deterministic components of the clock skews among said plurality of clock signals under test includes a step of finding the deterministic components of the clock skews by receiving said plurality of clock signals under test and determining an average value of errors in zero-crossing timings among said plurality of clock signals under test.

28. A probability estimating method for peak-to-peak clock skews as defined in claim 21, wherein said step of estimating said timing jitter sequences includes the following steps of:
transforming the clock signals under test into analytic signals of complex number;
determining instantaneous phase of the clock signals under test based on said analytic signals;
removing linear phase from said instantaneous phase to estimate instantaneous phase noise; and
receiving said instantaneous phase noise and resampling only instantaneous phase noise data closest to the real part of zero-crossing timings of said analytic signals to produce the timing jitter sequences.

29. A probability estimating method for peak-to-peak clock skews as defined in claim 28, wherein said step of transforming said signals under test into said analytic signals includes the following steps of:
extracting only components closest to a fundamental frequency from said clock signals under test to bandlimit said clock signals under test; and
Hilbert-transforming signals resultant of said bandwidth limiting said clock signals under test to generate a Hilbert conversion pair of the clock signals under test.

30. A probability estimating method for peak-to-peak clock skews as defined in claim 28, wherein said step of transforming said signals under test into said analytic signals includes the following steps of:
transforming said clock signals under test into both-side frequency spectra signals in a frequency domain;
extracting only components closest to a positive fundamental frequency from said both-side frequency spectra signals; and
transforming resultant signals back into time domain signals.

31. A probability estimating method for peak-to-peak clock skews as defined in claim 28, wherein said step of transforming said clock signals under test into said analytic signals includes the following steps of:
storing the clock signals under test in a buffer memory;
sequentially extracting the clock signal from the buffer memory while overlapping a part of said extracted clock signals with previously extracted clock signals;
multiplying a window function with each of said extracted clock signals;
transforming each of said multiplied signal into both-side frequency spectra signals in the frequency domain;

extracting only components closest to a positive fundamental frequency of the clock signals under test from said both-side frequency spectra signals transformed in the frequency domain;

transforming resultant band-limited frequency spectra signals back to time domain signals; and multiplying an inverse of said window function with the signals transformed into the time domain to obtain band-limited analytic signals.

32. A probability estimating method for peak-to-peak clock skews as defined in claim 28, wherein said step of estimating said timing jitter includes a step of receiving the instantaneous phase noise and removing low frequency components from said instantaneous phase noise.

33. A probability estimating method for peak-to-peak clock skews as defined in claim 17, wherein said step of estimating said clock skew sequences includes a step of conducting waveform clipping for the clock signals under test to remove amplitude modulation components in said clock signals under test thereby retaining only phase modulation components in said clock signals under test.

34. A probability estimating apparatus for peak-to-peak values in clock skews among a plurality of clock signals under test, comprising:

a clock skew estimator for estimating clock skew sequences among the plurality of clock signals under test; and a probability estimator for determining a generation probability of the peak-to-peak values in the clock skews among the plurality of clock signals under test based on the clock skew sequences from the clock skew estimator by applying Rayleigh distribution;

wherein said clock skew estimator includes a frequency multiplier for multiplying a frequency of said clock signals under test; and wherein said clock signals under test have pulse waveforms, and wherein said probability estimator estimates the generation probability of the peak-to-peak value based on RMS (root mean square) values of the clock signals under test obtained by the clock skew estimator by applying ratios between the peak-to-peak value and the RMS values determined by the Rayleigh distribution.

35. A probability estimating apparatus for peak-to-peak clock skews as defined in claim 34, wherein said clock skew estimator comprising:

a timing jitter estimator for estimating timing jitter sequences of the plurality of clock signals under test; and a clock skew calculator for receiving a plurality of said timing jitter sequences and calculating timing difference sequences among said timing jitter sequences;

wherein said frequency multiplier produces said timing jitter sequences which are multiple of a frequency of said clock signals under test.

36. A probability estimating method for peak-to-peak values in clock skews among a plurality of clock signals under test, comprising the steps of:

estimating the clock skew sequences among the plurality of clock signals under test; and determining a generation probability of a peak-to-peak value of the clock skews among the plurality of clock signals under test based on said clock skew sequences by applying Rayleigh distribution;

wherein said step of estimating the clock skew sequences includes a step of multiplying a frequency of said clock signals under test; and wherein said clock signals under test have pulse waveforms, and wherein said generation probability of the peak-to-peak value is estimated based on RMS (root mean square) values of the clock signals under test obtained by said step of estimating the clock skew by applying ratios between the peak-to-peak value and the RMS values determined by the Rayleigh distribution.

37. A probability estimating method for peak-to-peak clock skews as defined in claim 36, wherein said step of estimating said clock skew sequences include the following steps of:

estimating timing jitter sequences of the plurality of clock signals under test; and receiving a plurality of said timing jitter sequences and calculating timing differences among said timing jitter sequences to estimate the clock skew sequences;

wherein said step of estimating said clock skew sequences includes a step of producing timing jitter sequences of signals which are frequency multiplied by said clock signals under test.

* * * * *